US011444181B2

(12) United States Patent
Chang et al.

(10) Patent No.: US 11,444,181 B2
(45) Date of Patent: Sep. 13, 2022

(54) SOURCE/DRAIN FORMATION WITH REDUCED SELECTIVE LOSS DEFECTS

(71) Applicant: Taiwan Semiconductor Manufacturing Co., Ltd., Hsinchu (TW)

(72) Inventors: Chih-Chiang Chang, Zhubei (TW); Ming-Hua Yu, Hsinchu (TW); Li-Li Su, Chubei (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 17/157,444

(22) Filed: Jan. 25, 2021

(65) Prior Publication Data

US 2022/0029001 A1 Jan. 27, 2022

Related U.S. Application Data

(60) Provisional application No. 63/055,385, filed on Jul. 23, 2020.

(51) Int. Cl.
| | |
|---|---|
| *H01L 29/66* | (2006.01) |
| *H01L 21/20* | (2006.01) |
| *H01L 21/8234* | (2006.01) |
| *H01L 27/092* | (2006.01) |
| *H01L 29/417* | (2006.01) |
| *H01L 29/78* | (2006.01) |

(52) U.S. Cl.
CPC ........ *H01L 29/66795* (2013.01); *H01L 21/20* (2013.01); *H01L 21/823431* (2013.01); *H01L 27/0924* (2013.01); *H01L 29/41791* (2013.01); *H01L 29/785* (2013.01)

(58) Field of Classification Search
CPC .......................... H01L 29/785; H01L 29/0847
See application file for complete search history.

(56) References Cited

U.S. PATENT DOCUMENTS

| | | | |
|---|---|---|---|
| 2019/0067444 A1 | 2/2019 | Ching et al. | |
| 2020/0035563 A1* | 1/2020 | Zhang | H01L 29/66439 |
| 2020/0219970 A1* | 7/2020 | Mannebach | H01L 29/78696 |

* cited by examiner

*Primary Examiner* — Changhyun Yi
(74) *Attorney, Agent, or Firm* — Slater Matsil, LLP

(57) ABSTRACT

A method includes forming a first semiconductor fin and a second semiconductor fin in an n-type Fin Field-Effect (FinFET) region and a p-type FinFET region, respectively, forming a first dielectric fin and a second dielectric fin in the n-type FinFET region and the p-type FinFET region, respectively, forming a first epitaxy mask to cover the second semiconductor fin and the second dielectric fin, performing a first epitaxy process to form an n-type epitaxy region based on the first semiconductor fin, removing the first epitaxy mask, forming a second epitaxy mask to cover the n-type epitaxy region and the first dielectric fin, performing a second epitaxy process to form a p-type epitaxy region based on the second semiconductor fin, and removing the second epitaxy mask. After the second epitaxy mask is removed, a portion of the second epitaxy mask is left on the first dielectric fin.

20 Claims, 24 Drawing Sheets

US 11,444,181 B2

SOURCE/DRAIN FORMATION WITH REDUCED SELECTIVE LOSS DEFECTS

PRIORITY CLAIM AND CROSS-REFERENCE

This application claims the benefit of the following U.S. Provisional Application No. 63/055,385, filed on Jul. 23, 2020, and entitled "Special Consideration of Source/Drain (S/D) Epitaxy Process Flow Manufacturing For Advanced Node Devices," which application is hereby incorporated herein by reference.

BACKGROUND

In the formation of Fin Field-Effect Transistors (FinFETs), source/drain regions are typically formed by etching silicon fins to form recesses, and then performing an epitaxy process to grow epitaxy regions from the recesses. Since the source/drain regions of p-type FinFETs and n-type FinFETs are formed of different materials, the source/drain regions of p-type FinFETs and n-type FinFETs are formed in separate processes.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
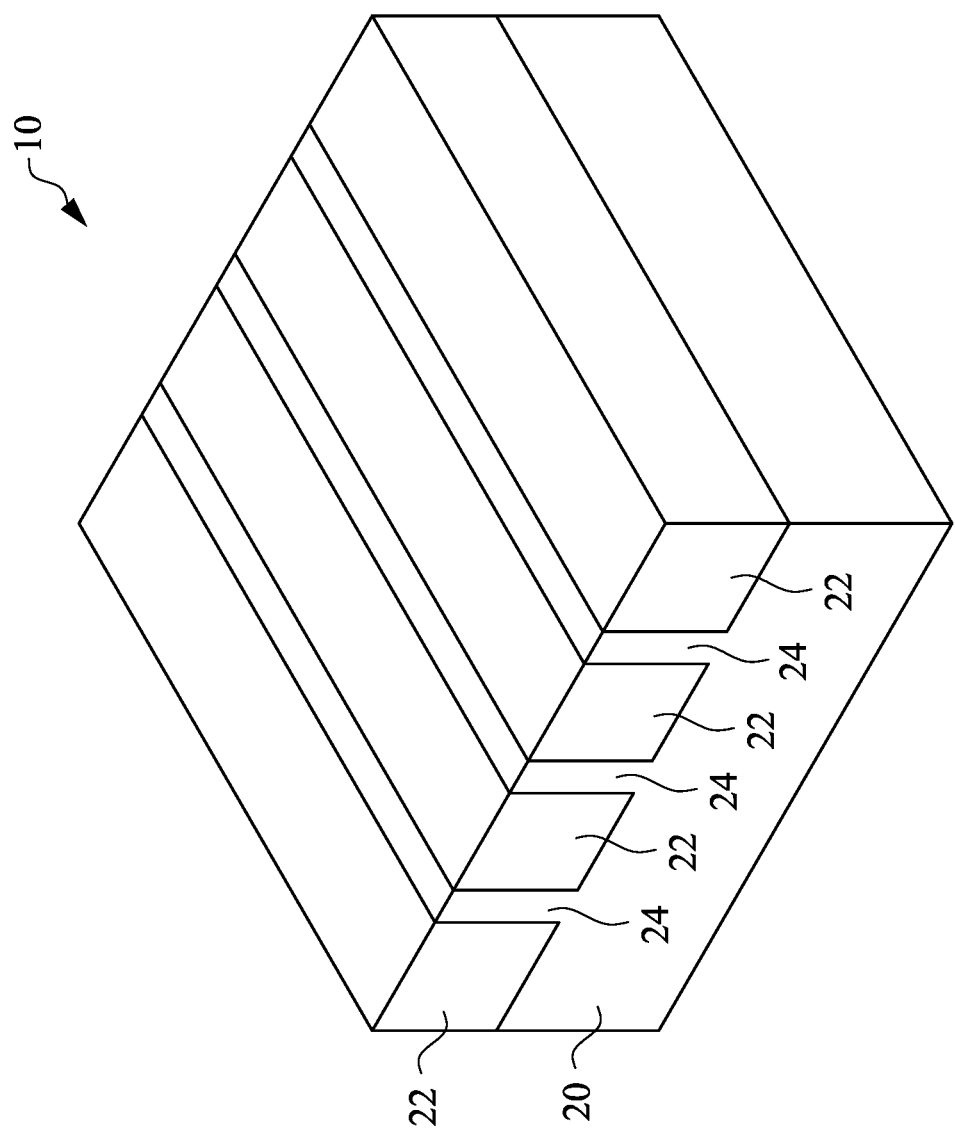
FIGS. 1-15, 16A, 16B, and 17-20 illustrate the perspective views, cross-sectional views, and a top view of intermediate stages in the formation of FinFETs separated by dielectric fins in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "underlying," "below," "lower," "overlying," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Fin Field-Effect Transistors (FinFETs) with source/drain regions and the method of forming the same are provided in accordance with some embodiments. The epitaxy processes for forming the source/drain regions may have selective loss defect, which is the adverse growth of source/drain material on dielectric material due to the loss of selectivity in some parts. In accordance with some embodiments, the source/drain regions of n-type FinFETs are formed before the source/drain regions of p-type FinFETs, so that the selective-loss defect is of n-type, and the later-formed source/drain region is of p-type. It is easier to remove n-type selective-loss defect during the subsequent p-type source/drain epitaxy (than the other way around) due to the ready availability of the appropriate process gas for removing the n-type selective-loss defect during the epitaxy of p-type source/drains. Embodiments discussed herein are to provide examples to enable making or using the subject matter of this disclosure, and a person having ordinary skill in the art will readily understand modifications that can be made while remaining within contemplated scopes of different embodiments. Throughout the various views and illustrative embodiments, like reference numbers are used to designate like elements. Although method embodiments may be discussed as being performed in a particular order, other method embodiments may be performed in any logical order.

Figure 23:
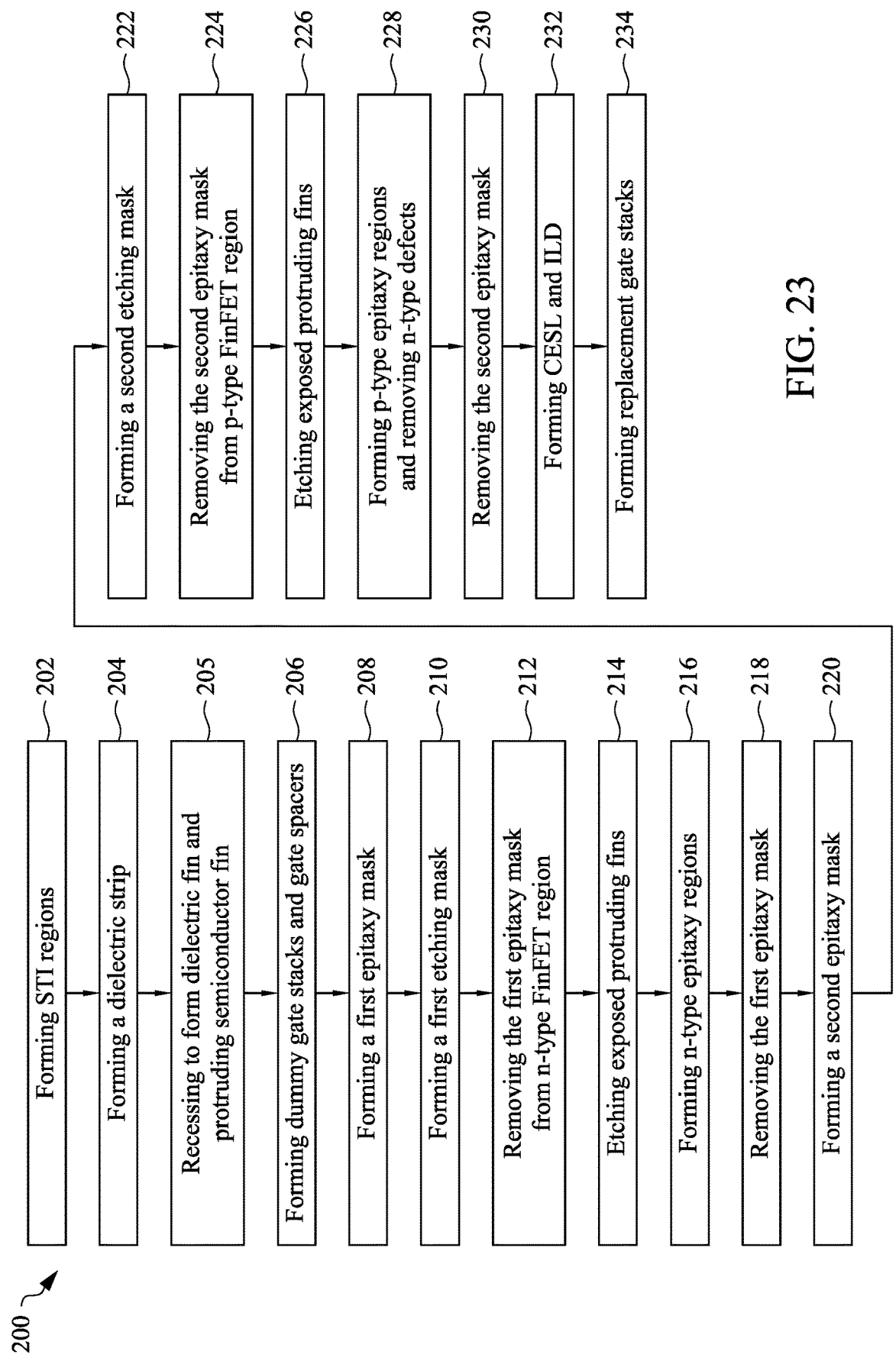
FIG. 23 illustrates a process flow for forming n-type and p-type FinFETs in accordance with some embodiments.

FIGS. 1-20 illustrate the perspective views, cross-sectional views, and a top view of intermediate stages in the formation of n-type FinFETs, p-type FinFETs, and their corresponding source/drain regions in accordance with some embodiments. The corresponding processes are also reflected schematically in the process flow 200 as shown in FIG. 23.

FIG. 1 illustrates a perspective view of an initial structure. The initial structure includes wafer 10, which further includes substrate 20. Substrate 20 may be a semiconductor substrate, which may be a silicon substrate, a silicon germanium substrate, or a substrate formed of other semiconductor materials. Substrate 20 may be doped with a p-type or an n-type impurity. Isolation regions 22 such as Shallow Trench Isolation (STI) regions may be formed to extend from a top surface of substrate 20 into substrate 20. The respective process is illustrated as process 202 in the process flow 200 as shown in FIG. 23. The portions of substrate 20 between neighboring STI regions 22 are referred to as semiconductor strips 24. In accordance with some embodiments of the present disclosure, semiconductor strips 24 are parts of the original substrate 20, and hence the material of semiconductor strips 24 is the same as that of substrate 20. In accordance with alternative embodiments of the present disclosure, semiconductor strips 24 are replacement strips formed by etching the portions of substrate 20 between STI regions 22 to form recesses, and performing an epitaxy process to regrow another semiconductor material in the recesses. Accordingly, semiconductor strips 24 are formed of a semiconductor material different from that of substrate 20. In accordance with some embodiments, semiconductor strips 24 are formed of Si, SiP, carbon-doped silicon, SiPC, SiGe, SiGeB, Ge, a III-V compound semiconductor such as InP, GaAs, AlAs, InAs, InAlAs, InGaAs, or the like.

STI regions 22 may include a liner oxide (not shown), which may be a thermal oxide formed through the thermal oxidation of a surface layer of substrate 20. The liner oxide may also be a deposited silicon oxide layer formed using, for example, Atomic Layer Deposition (ALD), High-Density Plasma Chemical Vapor Deposition (HDPCVD), Chemical Vapor Deposition (CVD), or the like. STI regions 22 may also include a dielectric material over the liner oxide, wherein the dielectric material may be formed using Flowable Chemical Vapor Deposition (FCVD), spin-on coating, or the like.

Figure 2:
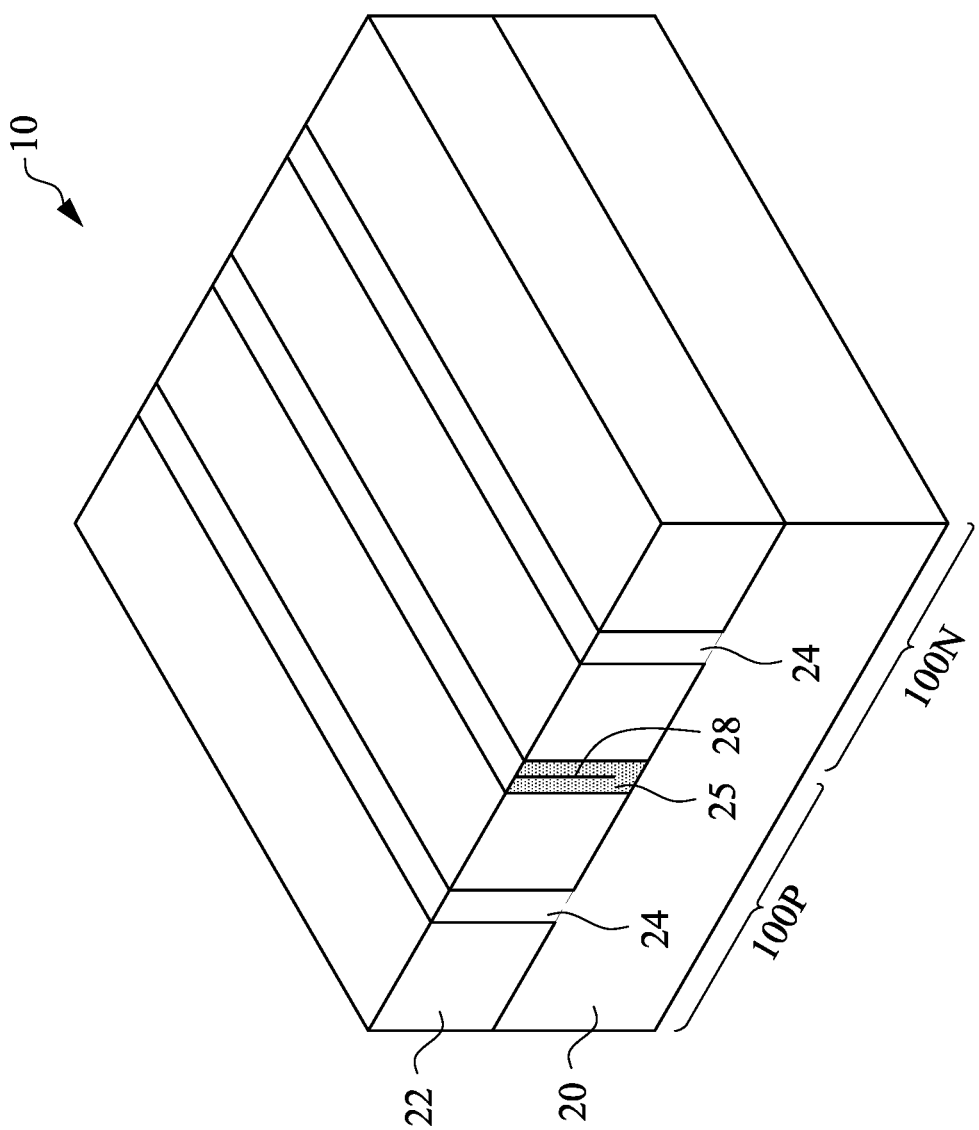

FIG. 2 illustrates the formation of dielectric dummy strip 25. The respective process is illustrated as process 204 in the process flow 200 as shown in FIG. 23. Dielectric dummy strip 25 may be formed through various methods. For example, dielectric dummy strip 25 may be formed by etching one of the semiconductor strips 24 to form a recess, and then filling the recessing with a dielectric material. Alternatively, dielectric dummy strip 25 may be formed by forming a large STI region 22, etching a portion of the large STI region 22 to form a trench, and filling the trench with a dielectric material different from the material of STI regions 22. The material of dielectric dummy strip 25 may be selected so that it has a high etching selectivity with relative to the materials of STI regions 22 (such as silicon oxide) and the materials of the subsequently formed dummy gate stacks. For example, the dielectric material may be formed of SiOC, SiON, SiOCN, or the like. The bottom surface of dielectric dummy strip 25 may be higher than, level with, or lower than, the bottom surfaces of STI regions 22.

In accordance with some embodiments, dielectric dummy strip 25 has seam 28 in the middle. The seam 28 may be caused by the conformal deposition of the dielectric material, so that the dielectric material is deposited on opposite sidewalls of the trench and grow toward each other, and eventually leaving seam 28 due to the pre-mature sealing of the remaining trench.

In accordance with some embodiments, dielectric dummy strip 25 separates p-type FinFET region 100P and n-type FinFET region 100N from each other. P-type FinFET region 100P is for forming a p-type FinFET in subsequent processes, and n-type FinFET region 100N is for forming an n-type FinFET in subsequent processes. More details of p-type FinFET region 100P and n-type FinFET region 100N are illustrated in FIGS. 6 through 15.

Figure 3:
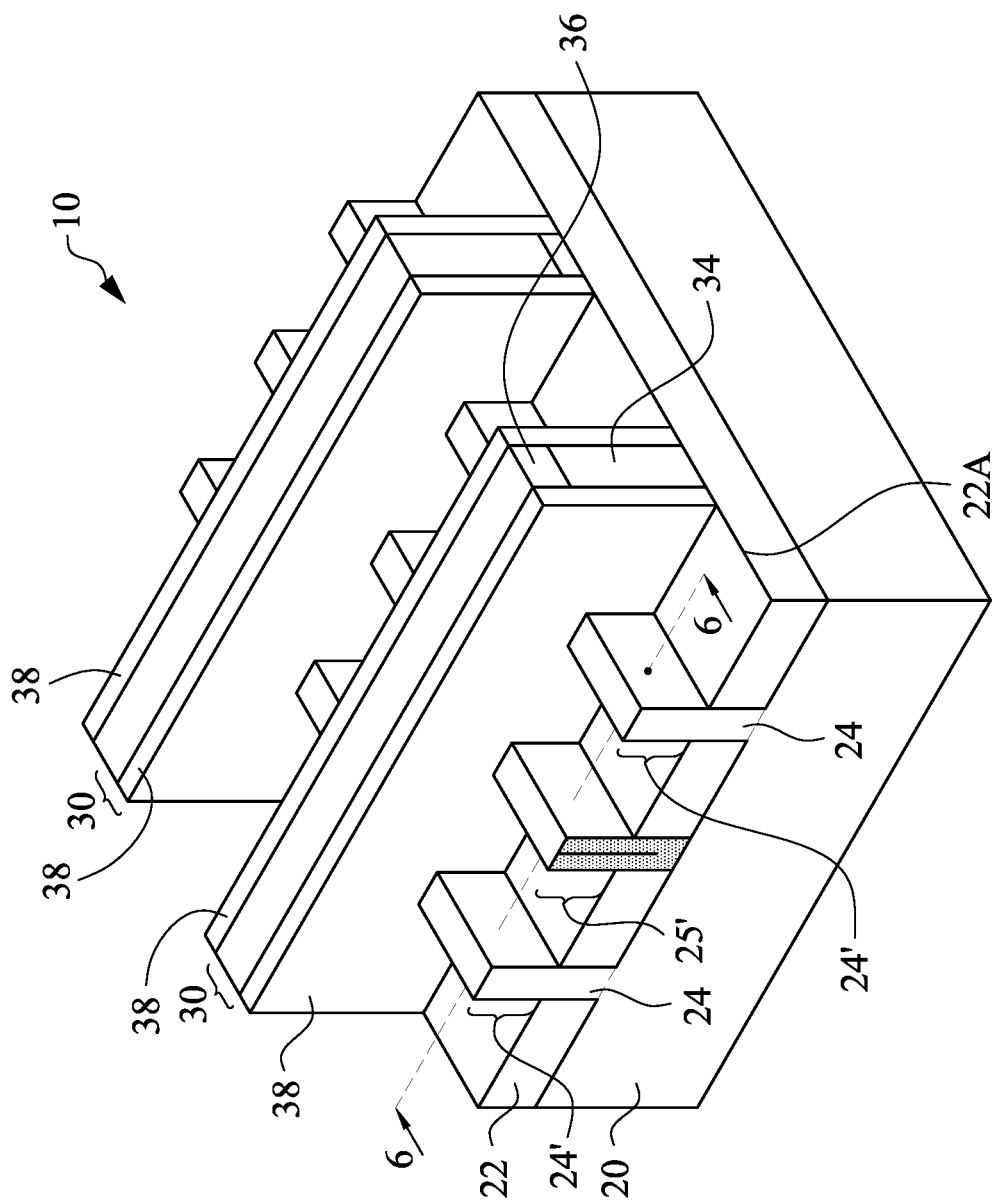

Referring to FIG. 3, STI regions 22 are recessed. The top portions of semiconductor strips 24 and dielectric dummy strip 25 protrude higher than the top surfaces 22A of the remaining portions of STI regions 22 to form protruding fins 24' and dummy fin 25', respectively. The respective process is illustrated as process 205 in the process flow 200 as shown in FIG. 23. The etching may be performed using a dry etching process, wherein etching gases such as the mixture of HF and NH$_3$ may be used. In accordance with alternative embodiments of the present disclosure, the recessing of STI regions 22 is performed using a wet etching process. The etching chemical may include a diluted HF solution, for example.

In above-illustrated embodiments, the fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers, or mandrels, may then be used to pattern the fins.

Further referring to FIG. 3, dummy gate stacks 30 and gate spacers 38 are formed on the top surfaces and the sidewalls of protruding semiconductor fins 24' and dummy fin 25'. The respective process is illustrated as process 206 in the process flow 200 as shown in FIG. 23. Dummy gate stacks 30 may include dummy gate dielectrics (not shown) on the top surface and sidewalls of protruding fins 24'. Dummy gate stacks 30 may further include dummy gate electrodes 34 over the dummy gate dielectrics. Dummy gate electrodes 34 may be formed, for example, using polysilicon or amorphous silicon, and other materials may also be used. Each of dummy gate stacks 30 may also include one (or a plurality of) hard mask layer 36 over dummy gate electrode 34. Hard mask layers 36 may be formed of silicon nitride, silicon oxide, silicon carbo-nitride, or multi-layers thereof. Dummy gate stacks 30 may cross over a single one or a plurality of protruding fins 24' and dummy fins 25' and/or STI regions 22. Dummy gate stacks 30 also have lengthwise directions perpendicular to the lengthwise directions of protruding fins 24' and dummy fin 25'.

Next, gate spacers 38 are formed on the sidewalls of dummy gate stacks 30. The respective process is also illustrated as process 206 in the process flow 200 as shown in FIG. 23. In accordance with some embodiments of the present disclosure, gate spacers 38 are formed of a dielectric material such as silicon nitride (SiN), silicon oxide (SiO$_2$), silicon carbo-nitride (SiCN), silicon oxynitride (SiON), silicon oxy-carbo-nitride (SiOCN), or the like, and may have a single-layer structure or a multi-layer structure including a plurality of dielectric layers. Gate spacers 38 may have widths in the range between about 1 nm and about 3 nm.

Figure 4:
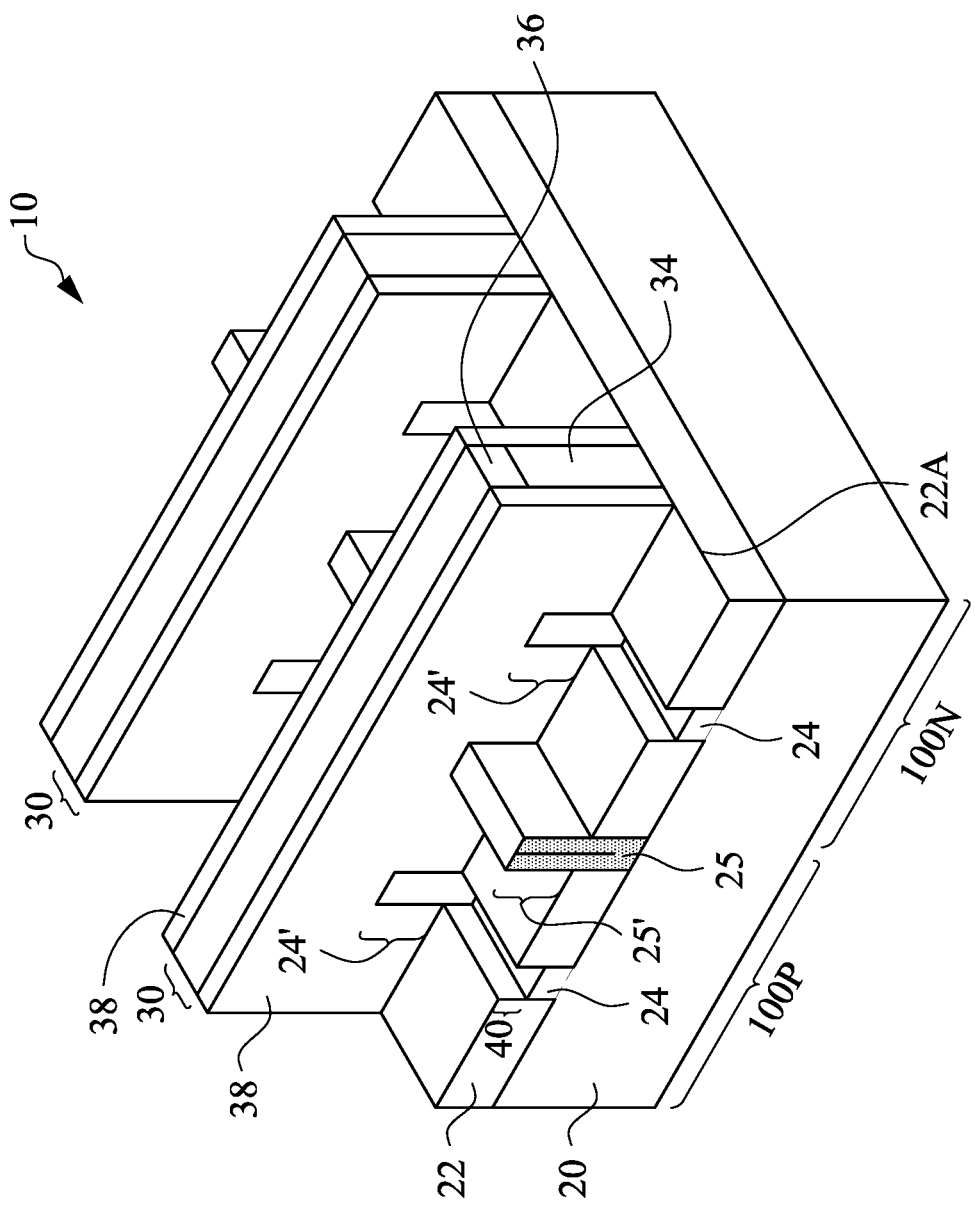
Figure 5:
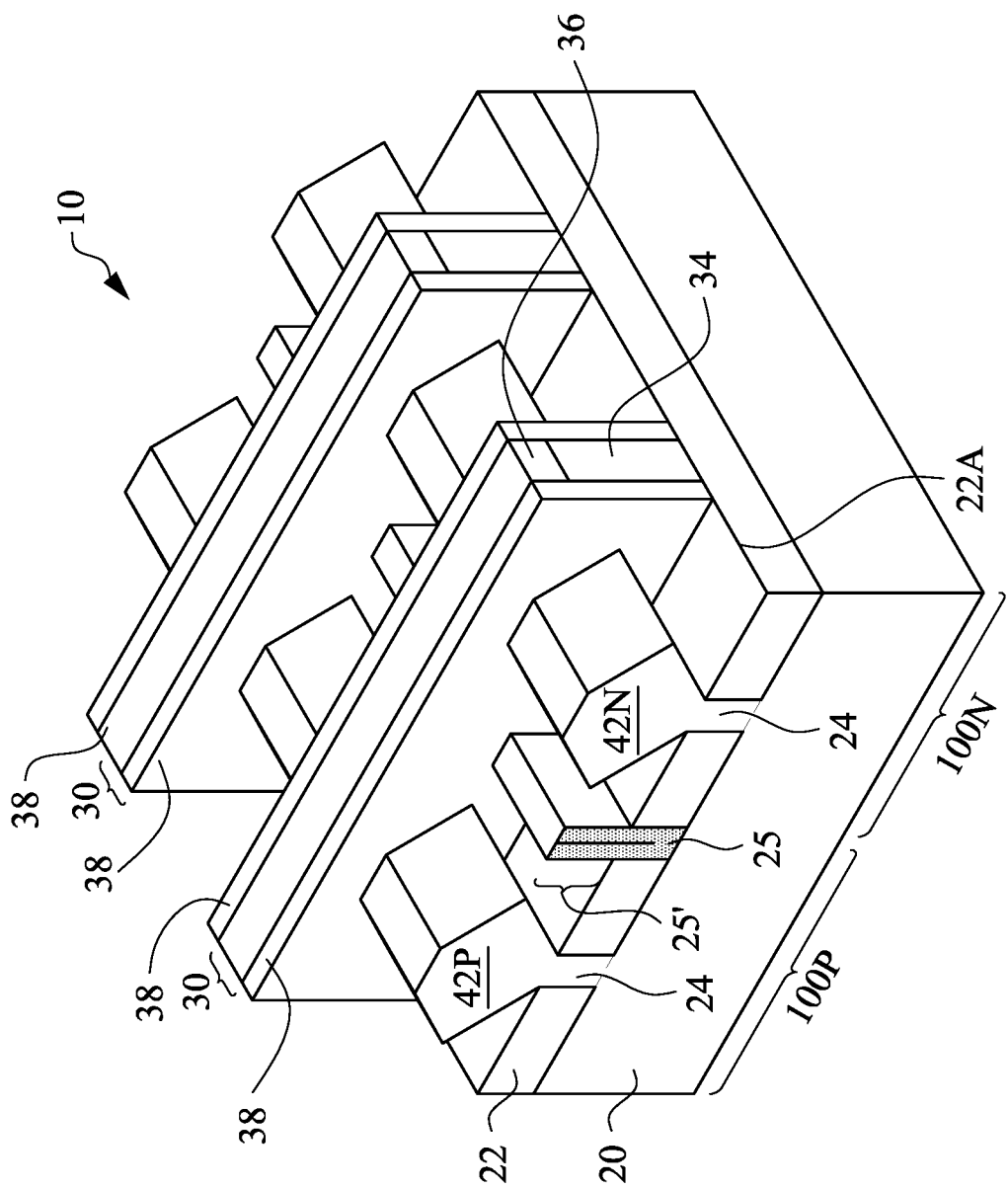

FIGS. 4 and 5 schematically illustrate the recessing of protruding fins and the formation of source/drain regions through epitaxy in accordance with some embodiments. In accordance with some embodiments of the present disclosure, etching processes (referred to as source/drain recessing hereinafter) are performed to etch the portions of protruding fins 24' that are not covered by dummy gate stack 30 and gate spacers 38, resulting recesses 40 to be formed. It is appreciated that the processes shown in FIGS. 4 and 5 are brief, and the details for performing these processes are shown in FIGS. 6 through 15. FIGS. 4 and 5 thus merely show what the recesses 40 and the resulting source/drain regions 42 look like in a perspective view, rather than show the sequence of the formation. For example, the recessing of protruding fins 24' in p-type FinFET region 100P and n-type FinFET region 100N may be performed in separate etching processes rather than performed in a common process as shown in FIG. 4.

The recessing may be anisotropic, and hence the portions of protruding fins 24' directly underlying dummy gate stacks 30 and gate spacers 38 are protected, and are not etched. The top surfaces of the recessed semiconductor strips 24 may be lower than the top surfaces 22A of STI regions 22 in accordance with some embodiments. The spaces left by the etched portions of protruding fins 24' are referred to as recesses 40. In the etching process, dielectric dummy fin 25' is not etched. For example, protruding fins 24' may be etched using the mixture of NF$_3$ and NH$_3$, the mixture of HF and NH$_3$, or the like.

Epitaxy regions (source/drain regions) 42P and 42N, which are collectively and individually referred to as source/drain regions 42, are formed. Epitaxy regions 42P and 42N are formed by selectively growing semiconductor materials from recesses 40, resulting in the structure in FIG. 5. It is appreciated that the source/drain regions 42 of the p-type FinFETs and n-type FinFETs may have different shapes, and the details of the shapes are shown in FIG. 15. Furthermore, the dielectric dummy fin 25' in p-type FinFET region 100P and the dielectric dummy fin 25' in n-type FinFET region 100N may have different thicknesses and/or different layered structures, which are also discussed in detail referring to FIGS. 6 through 15.

Figure 6:
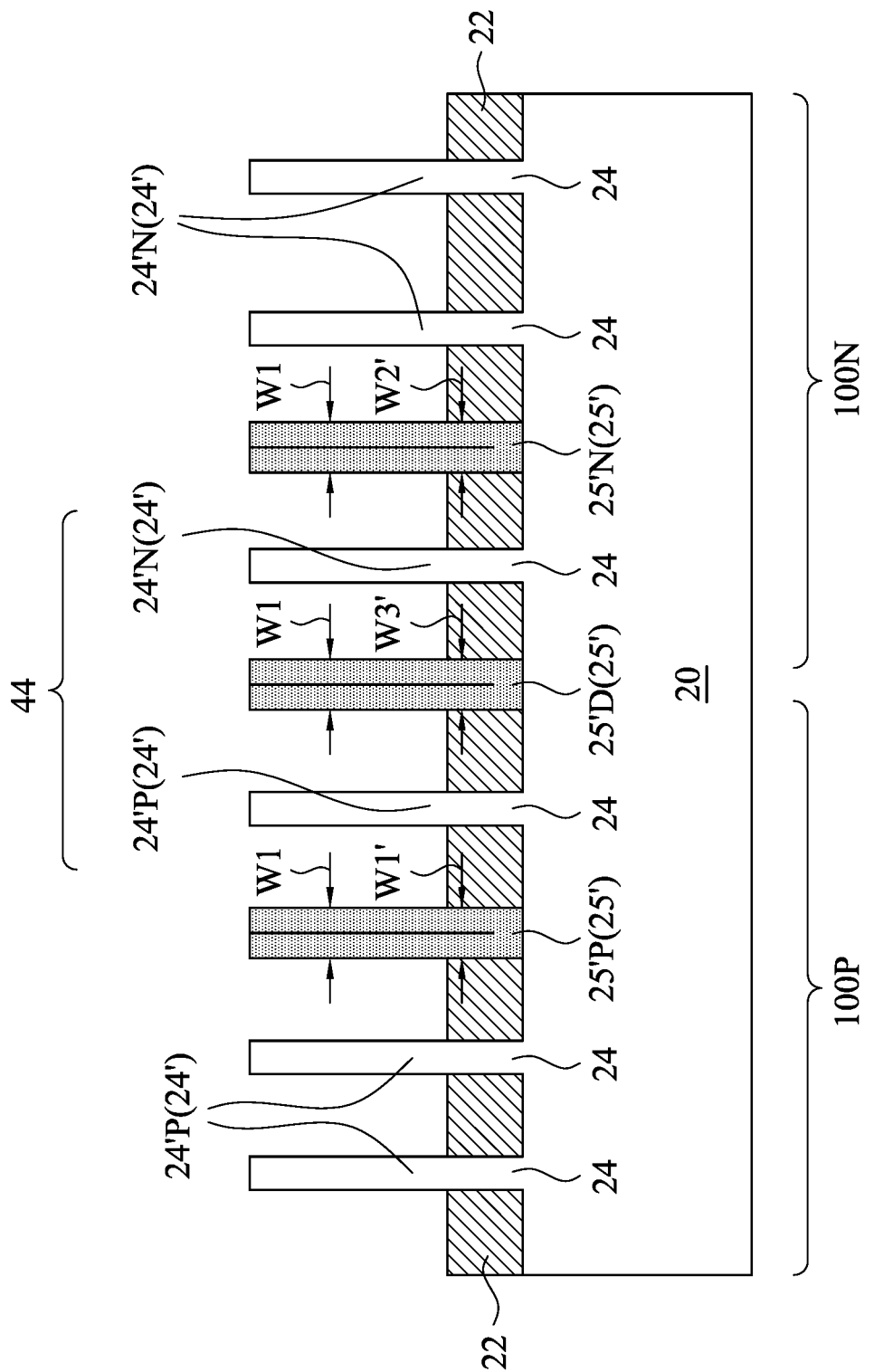

FIG. 6 illustrates a cross-sectional view showing p-type FinFET region 100P and n-type FinFET region 100N, and protruding fins 24' and dummy fins 25' in p-type FinFET region 100P and n-type FinFET region 100N. Furthermore, one of dummy fins 25' may act as a dividing feature for dividing p-type FinFET region 100P and n-type FinFET region 100N, and is referred to as dummy fins 25'D hereinafter. For distinguishing purpose, the protruding fins 24' in p-type FinFET region 100P and n-type FinFET region 100N are referred to as protruding fins 24'P and 24'N, respectively, and the dummy fins 25' in p-type FinFET region 100P and n-type FinFET region 100N are referred to as dummy fins 25'P and 25'N, respectively. Furthermore, the cross-sectional view shown in FIG. 6 shows a reference cross-section 6-6 in FIG. 3, and the perspective view shown in FIG. 3 illustrates a portion 44 in FIG. 6. Accordingly, dummy gate stacks 30 (FIG. 3) are not shown in FIG. 6. In FIG. 6, the widths W1 of dielectric fins 25'P, 25'D, and 25'N are substantially equal to each other. Furthermore, width W1', W2', and W3' may be substantially equal to each other.

Figure 7:
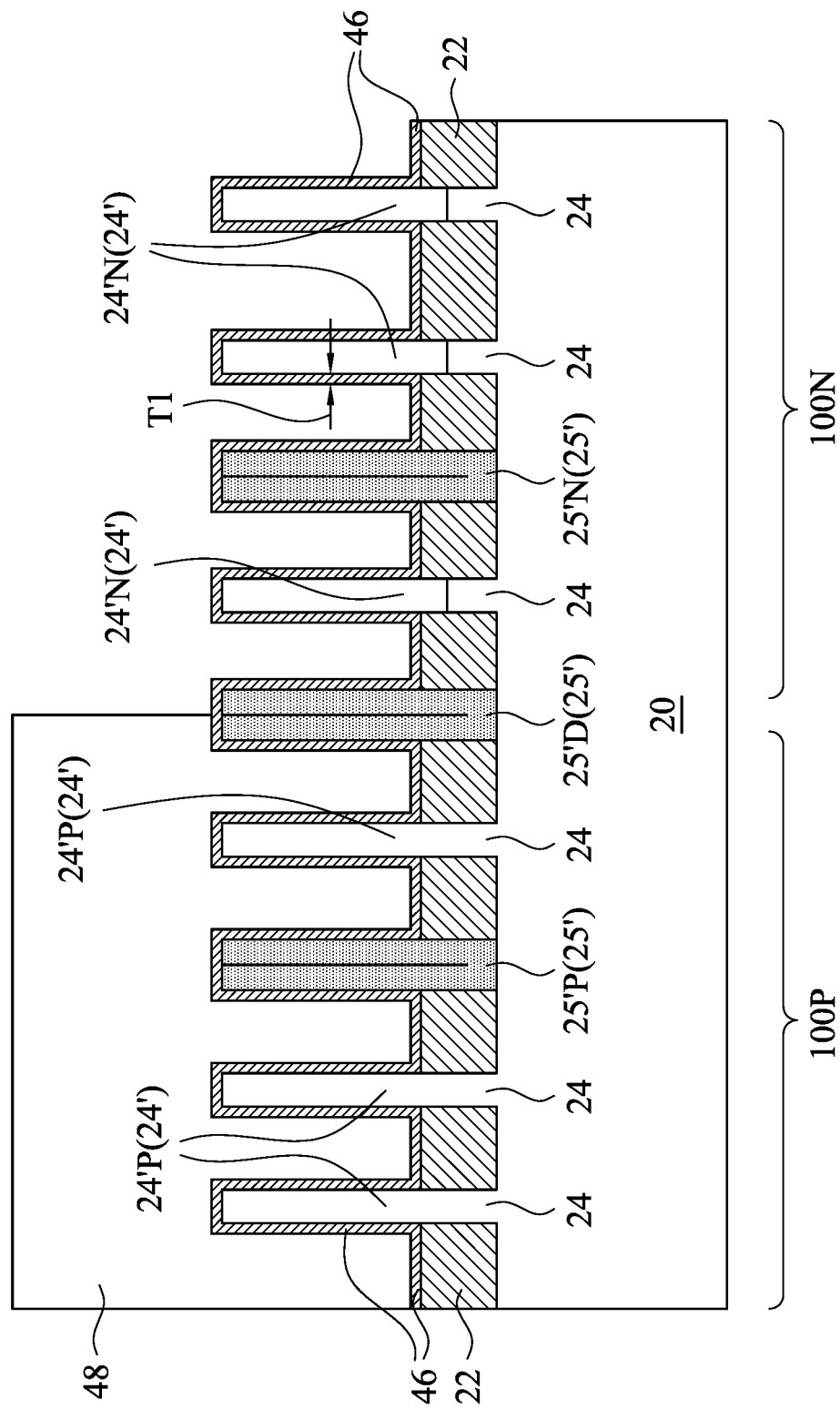

Referring to FIG. 7, a first epitaxy mask 46 is formed. The respective process is illustrated as process 208 in the process flow 200 as shown in FIG. 23. In accordance with some embodiments, epitaxy mask 46 is formed of a dielectric material, which may be formed of or comprise SiON, SiOCN, AlO, SiN, SiOC, $SiO_2$, or the like. The material of epitaxy mask 46 and dielectric fins 25' may be the same or different from each other. Accordingly, epitaxy mask 46 and dielectric fins 25' may be, or may not be, distinguished from each other. The thickness T1 of epitaxy mask 46 may be in the range between about 0.5 nm and about 2.5 nm in accordance with some embodiments. Epitaxy mask 46 may be formed as a conformal layer having the horizontal thickness of horizontal portions and vertical thickness of vertical portions being equal to (or substantially equal to) each other, for example, with a variation smaller than about 20 percent. Epitaxy mask 46 may be a single layer or a composite layer including a plurality of sub layers. The sub layers may be formed of materials different from each other, and the different materials may be formed of materials selected from the aforementioned materials. Alternatively, the sub layers in epitaxy mask 46 may include the same elements, for example, Si, O, C, and N, while the atomic percentages of the sub layers are different from each other. In accordance with some embodiments of the present disclosure, epitaxy mask 46 is deposited using a conformal deposition process such as Atomic Layer deposition (ALD), Chemical Vapor Deposition (CVD), or the like. At the same time epitaxy mask 46 is deposited on protruding fins 24' and dielectric fins 25', it is also deposited on the top surfaces and sidewalls of gate stacks 30 and gate spacers 38 as shown in FIG. 3.

Etching mask 48 is also formed and deposited. The respective process is illustrated as process 210 in the process flow 200 as shown in FIG. 23. In accordance with some embodiments, etching mask 48 is formed of or comprises a photo resist. Other layers such as Bottom Anti-Reflective Coating (BARC), hard mask layer, etc., may be, or may not be formed as parts of the etching mask 48. Etching mask 48 is patterned to cover p-type FinFET region 100P, and leaves n-type FinFET region 100N exposed. In accordance with some embodiments, an edge of etching mask 48 is aligned to dielectric fin 25'D.

Figure 8:
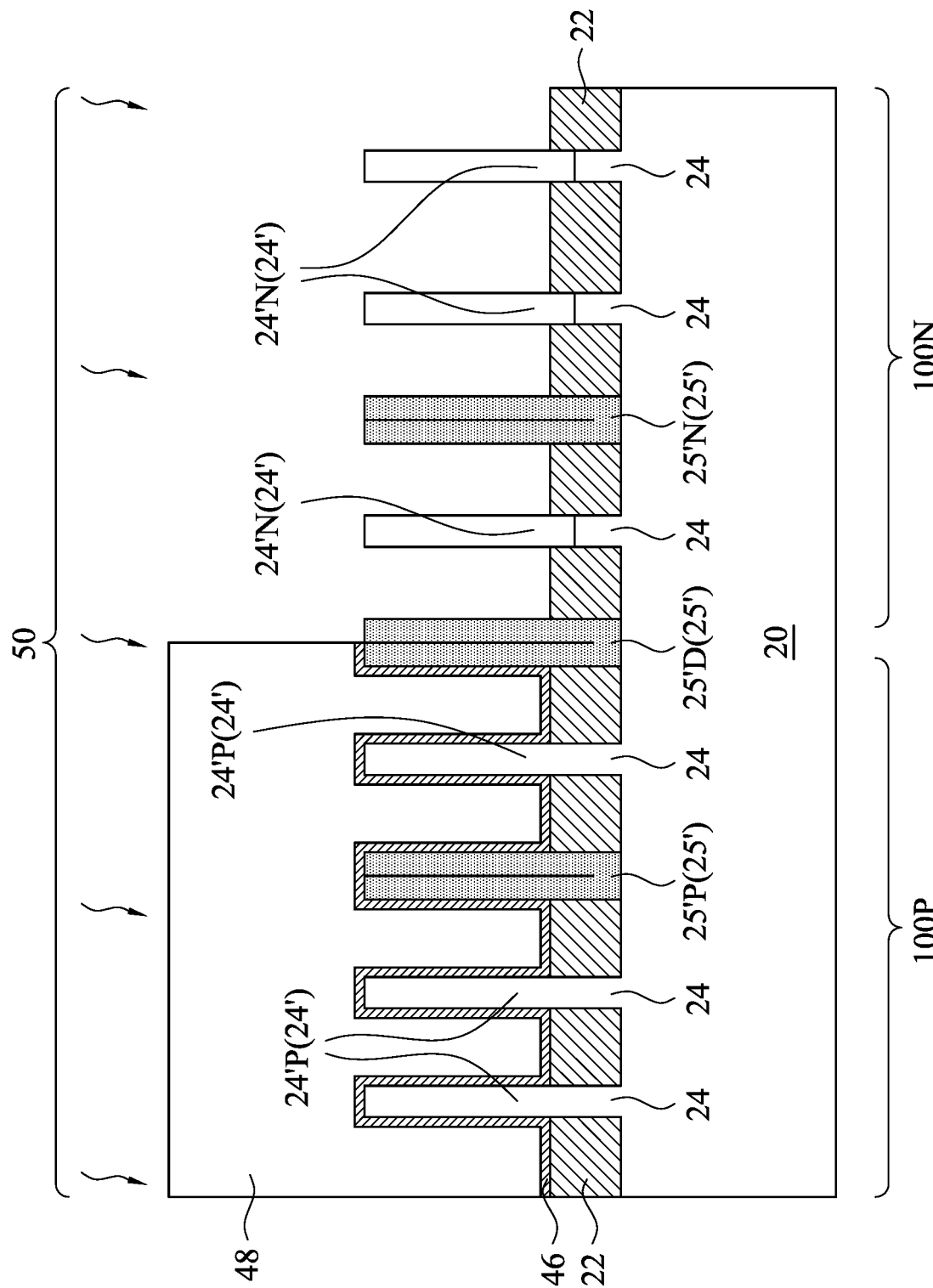

Referring to FIG. 8, an etching process 50 is performed to remove the portion of epitaxy mask 46 in n-type FinFET region 100N, while the portion of epitaxy mask 46 in p-type FinFET region 100P is protected from being removed by etching mask 48. The respective process is illustrated as process 212 in the process flow 200 as shown in FIG. 23. The etching process is an isotropic process, which may be a dry etching process or a wet etching process. Accordingly, epitaxy mask 46 may be fully removed from n-type FinFET region 100N.

Figure 9:
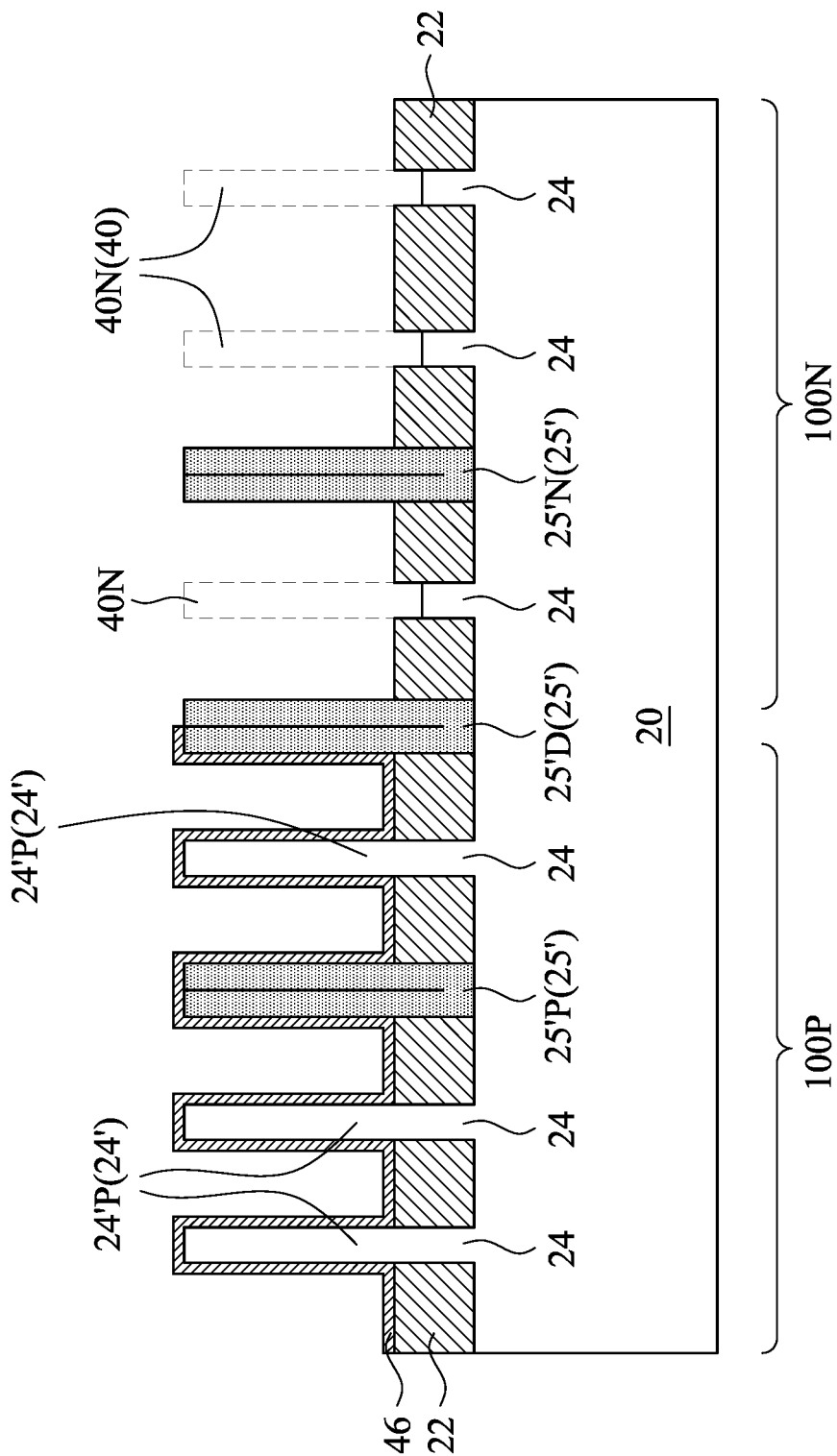

Next, protruding fins 24'N are removed through etching, and hence forming recesses 40N, which is also shown as 40 in FIG. 4. The resulting structure is shown in FIG. 9. The respective process is illustrated as process 214 in the process flow 200 as shown in FIG. 23. Etching mask 48 is also removed, and may be removed before or after the etching of protruding fins 24'N. In accordance with some embodiments, the etching of protruding fins 24'N is performed until recesses 40N extend to a level lower than the top surfaces of STI regions 22.

Figure 10:
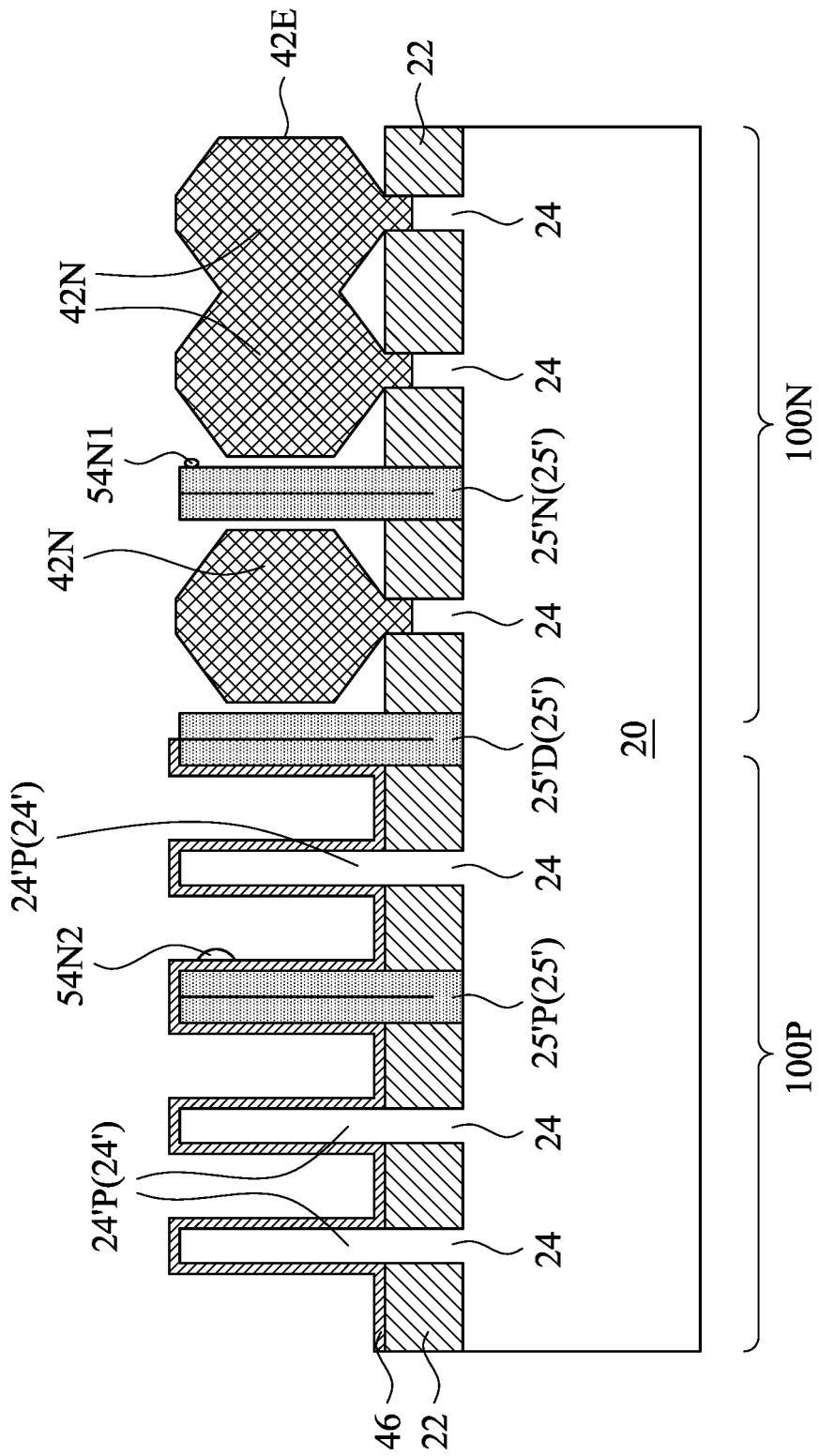

Referring to FIG. 10, epitaxy regions 42N, which are also referred to as epitaxy regions 42, are formed in a first selective epitaxy process, in which a semiconductor material is selectively grown starting from recesses 40N. The respective process is illustrated as process 216 in the process flow 200 as shown in FIG. 23. In accordance with some embodiments, epitaxy regions 42N are formed of or comprise silicon phosphorous (SiP), silicon carbon phosphorous (SiCP), silicon, or the like. Epitaxy regions 42N form the source/drain regions of the resulting n-type FinFET, and are also referred to as source/drain regions 42N. In accordance with some embodiments, for example, when the epitaxy material is silicon, an implantation process may be performed to implant an n-type impurity into epitaxy regions 42N. In accordance with alternative embodiments, for example, when the epitaxy material already includes an n-type impurity such as phosphorous, the implantation process may be skipped. Each of epitaxy regions 42N may also include a plurality of sub layers, for example, with the atomic percentage of phosphorous in the plurality of sub layers being different from each other. In accordance with some embodiments, epitaxy regions 42N have straight and vertical edges, and slanted facets. Epitaxy regions 42N may also include planar top surfaces. Epitaxy regions 42N may extend all the way to the neighboring dielectric fins 25'N, or may be spaced apart from the neighboring dielectric fins 25'N by gaps.

The epitaxy process is selective, for example, with an etching gas such as HCl included in the process gas. The selective deposition results in the semiconductor material to be grown on semiconductor materials, but not on dielectric materials such as dielectric fins 25', gate spacers 38 (FIG. 5), and hard mask 36 (FIG. 5), etc. It is appreciated that sometimes, defects may be generated due to the loss of selectivity in certain regions, so that the semiconductor material are adversely grown on dielectric materials such as on gate spacers 38, dielectric fins 25', etc. For example, FIG. 10 schematically illustrates defect 54N1 in n-type FinFET region 100N, and defect 54N2 in p-type FinFET region 100P, which are undesirable semiconductor materials. The defects 54N1 and 54N2 are also referred to as selective-loss defects since they are formed due to the loss of selectivity. The existence of selective-loss defect 54N1 does not significantly affect the subsequent processes because it will not grow larger, and hence can be removed in subsequent cleaning processes. Accordingly, selective-loss defect 54N1 is not illustrated in subsequent Figures. It has been found that it is easier to remove the n-type selective-loss defect (such as SiP) than p-type selective-loss defects (such as SiGeB) due to the readily available process gases that can effectively remove the n-type selective-loss defect, but less-effective in removing the p-type selective-loss defect. Accordingly, in the embodiments of the present disclosure, an n-first process is adopted, which means the n-type epitaxy regions (source/drain regions) are formed before the formation of the p-type epitaxy regions.

An etching process is then performed to remove the remaining portion of epitaxy mask 46 in p-type FinFET region 100P. The respective process is illustrated as process 218 in the process flow 200 as shown in FIG. 23. The etching process is an isotropic process, which may be a dry etching process or a wet etching process, and the etching chemical is selected based on the material of epitaxy mask 46, protruding fins 24', and epitaxy regions 42N. Protruding fins 24' and dielectric fins 25' are thus re-exposed. If selective-loss defect 54N2 is formed, it is not removed in the removal of epitaxy mask 46, and will also adversely protect the underlying portion of epitaxy mask 46 from being removed.

Figure 11:
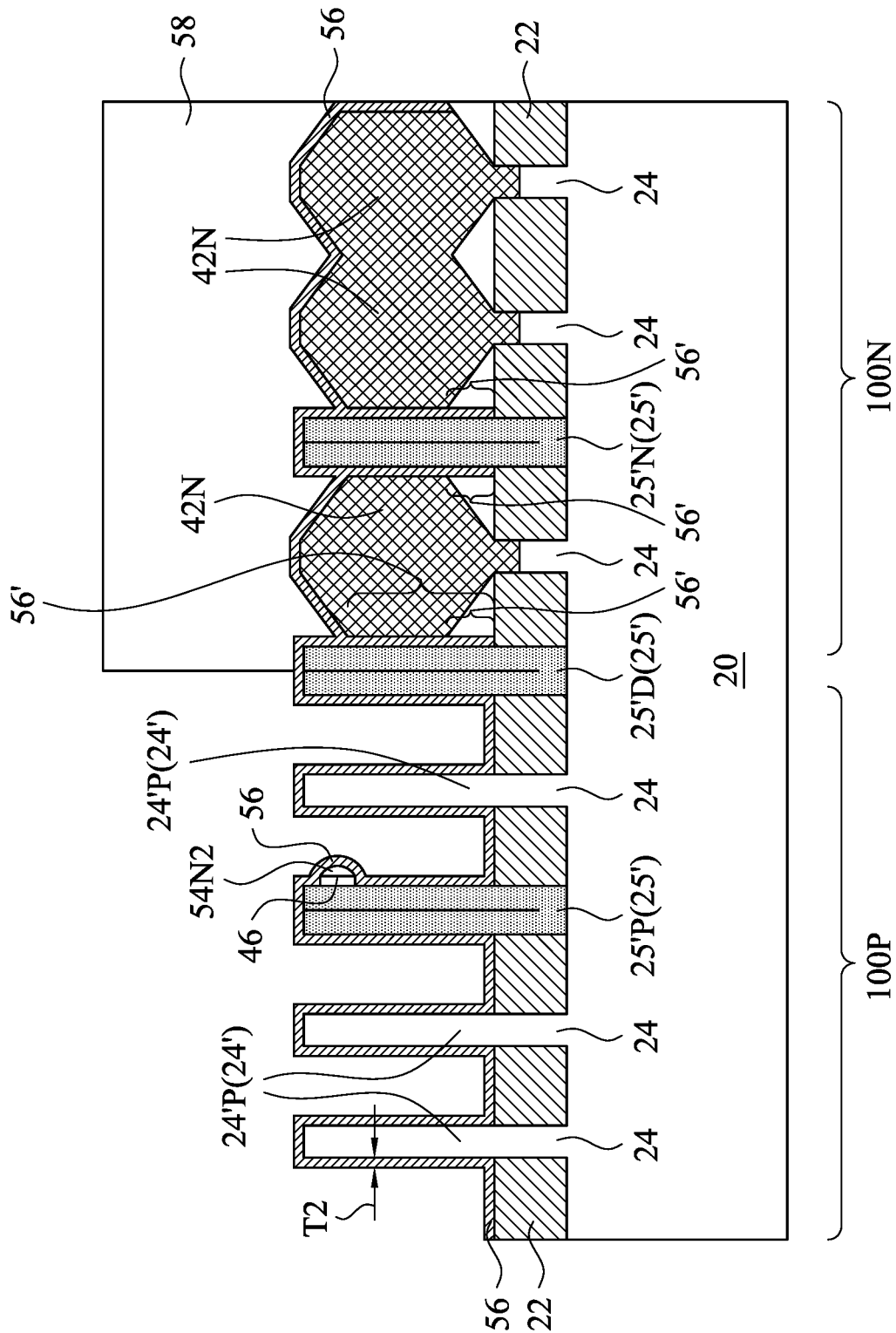

Referring to FIG. 11, a second epitaxy mask 56 is formed. The respective process is illustrated as process 220 in the process flow 200 as shown in FIG. 23. In accordance with some embodiments, epitaxy mask 56 is formed of a dielectric material, which may be formed of or comprise SiON, SiOCN, AlO, SiN, SiOC, $SiO_2$, or the like. The material of epitaxy mask 56 may be the same as or different from the material of dielectric fin 25', and may be the same as or different from the material of epitaxy mask 46. The material(s) of epitaxy mask 56 may be selected from the same group of candidate materials for forming epitaxy mask 46. Epitaxy mask 56 and dielectric fin 25' may be, or may not be, distinguishable from each other. The thickness T2 of epitaxy mask 56 may be in the range between about 0.5 nm and about 2.5 nm in accordance with some embodiments. Epitaxy mask 56 may be a single layer or a composite layer including a plurality of sub layers, which may be formed of materials selected from the aforementioned materials. Alternatively, the sub layers in epitaxy mask 56 may include the same elements, for example, Si, O, C, and N, but the atomic percentage of the sub layers are different from each other. In accordance with some embodiments of the present disclosure, epitaxy mask 56 is deposited using a conformal deposition process such as ALD, CVD, or the like. At the same time epitaxy mask 56 is deposited on protruding fins 24' and dielectric fins 25', it is also deposited on the top surfaces and sidewalls of gate stacks 30 and gate spacers 38 as shown in FIG. 3.

In accordance with some embodiments in which selective-loss defect 54N2 and the underlying portion of epitaxy mask 46 are left by the preceding processes, epitaxy mask 56 covers selective-loss defect 54N2 and the underlying portion of epitaxy mask 46.

As shown in FIG. 11, in accordance with some embodiments, some or all of epitaxy regions 42N are spaced apart from the neighboring dielectric fins 25'N by gaps. Accordingly, epitaxy mask 56 extends down (in and through the gaps) all the way to the top surface of STI region 22. It is also possible that some or all of epitaxy regions 42N are joined with neighboring dielectric fins 25'N. Accordingly, the respective epitaxy mask 56 is formed above the point where epitaxy regions 42N meets the corresponding dielectric fins 25'N, and does not extend to the spaces below the meeting point. For example, as shown in FIG. 11, portions 56' of epitaxy mask 56 will not be formed when dielectric fin 25'D and/or 25'N joins their neighboring epitaxy region 42N. In another example, portions 56' will be formed when dielectric fin 25'D and/or 25'N are spaced apart from it neighboring epitaxy region 42N.

Further referring to FIG. 11, a patterned etching mask 58 is formed. The respective process is illustrated as process 222 in the process flow 200 as shown in FIG. 23. Etching mask 58 may be formed of the same or similar material as, and may have the similar structure as, etching mask 48 (FIG. 7). Etching mask 58 is patterned to cover n-type FinFET region 100N, and leaves p-type FinFET region 100P exposed. In accordance with some embodiments, an edge of etching mask 58 is aligned to dielectric fin 25'D.

Figure 12:
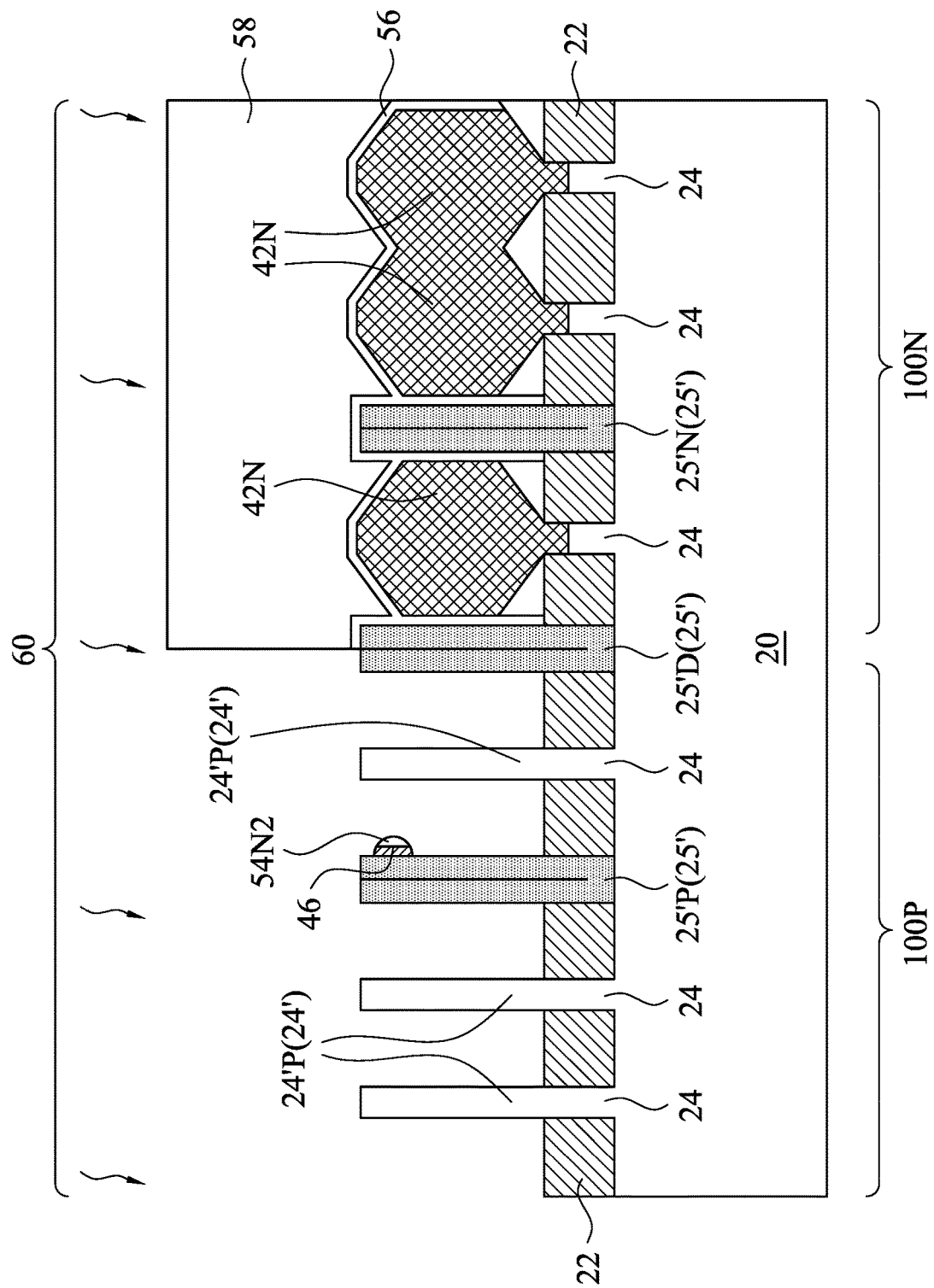

Referring to FIG. 12, etching process 60 is performed to remove the portion of epitaxy mask 56 in p-type FinFET region 100P, while the portion of epitaxy mask 56 in n-type FinFET region 100N is protected from being removed by etching mask 58. The respective process is illustrated as process 224 in the process flow 200 as shown in FIG. 23. The etching process is an isotropic process, which may be a dry etching process or a wet etching process, and the etching chemical is selected based on the material of epitaxy mask 56 and protruding fins 24'P, so that the exposed portion of epitaxy mask 56 is removed, while the protruding fins 24'P, which are exposed after the removal of epitaxy mask 56, are not damaged. After the etching, selective-loss defect 54N2, if any, will be revealed again.

Figure 13:
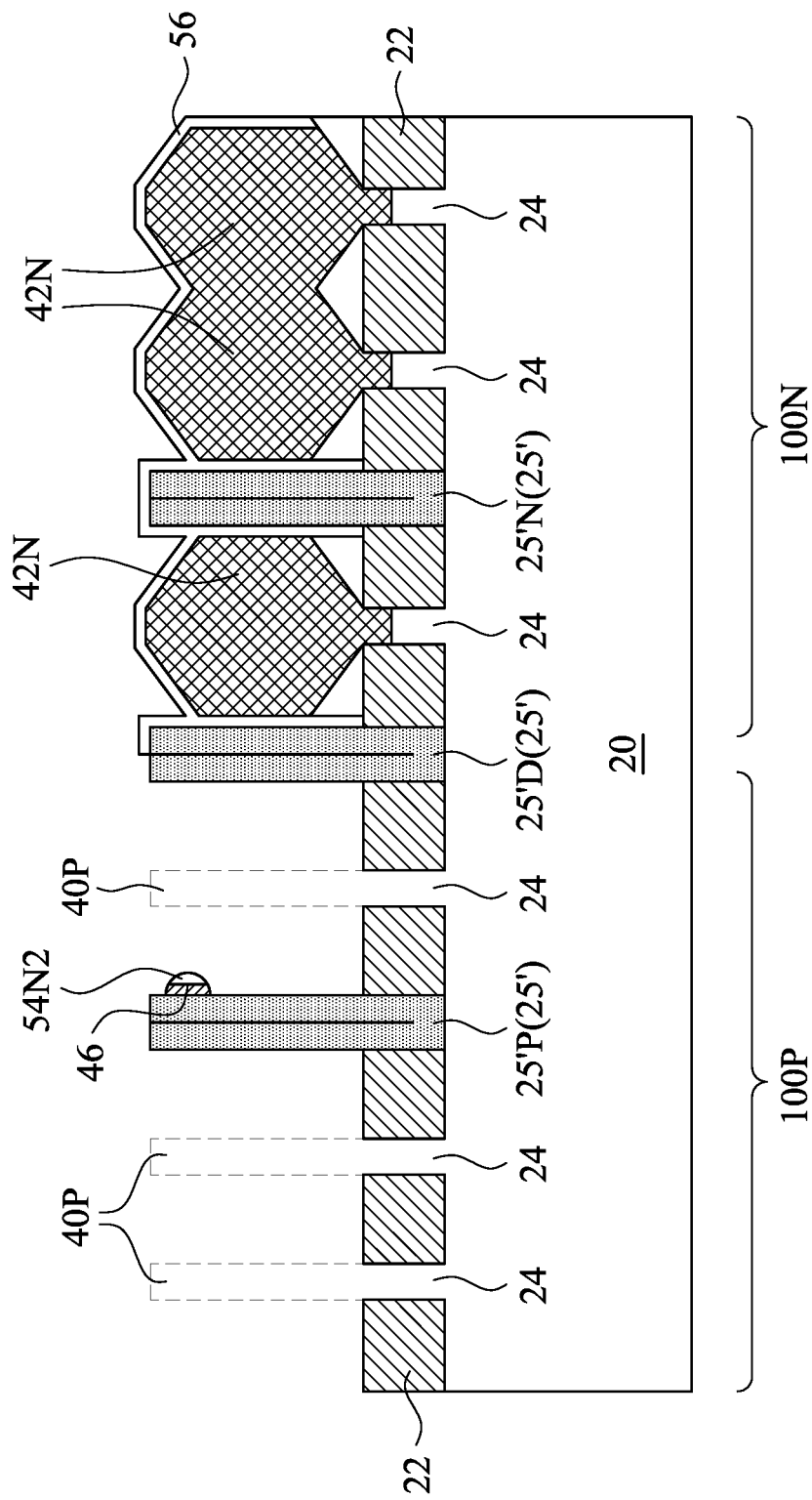

The etching mask 58 as shown in FIG. 12 is removed, and protruding fins 24'P are removed through etching. The resulting structure is shown in FIG. 13. Recesses 40P are formed as a result of the etching. The respective process is illustrated as process 226 in the process flow 200 as shown in FIG. 23. Etching mask 58 is also removed, and may be removed before or after the etching of protruding fins 24'P. In accordance with some embodiments, the etching of protruding fins 24'P is performed until recesses 40P extend to a level lower than the top surfaces of STI regions 22.

Figure 14:
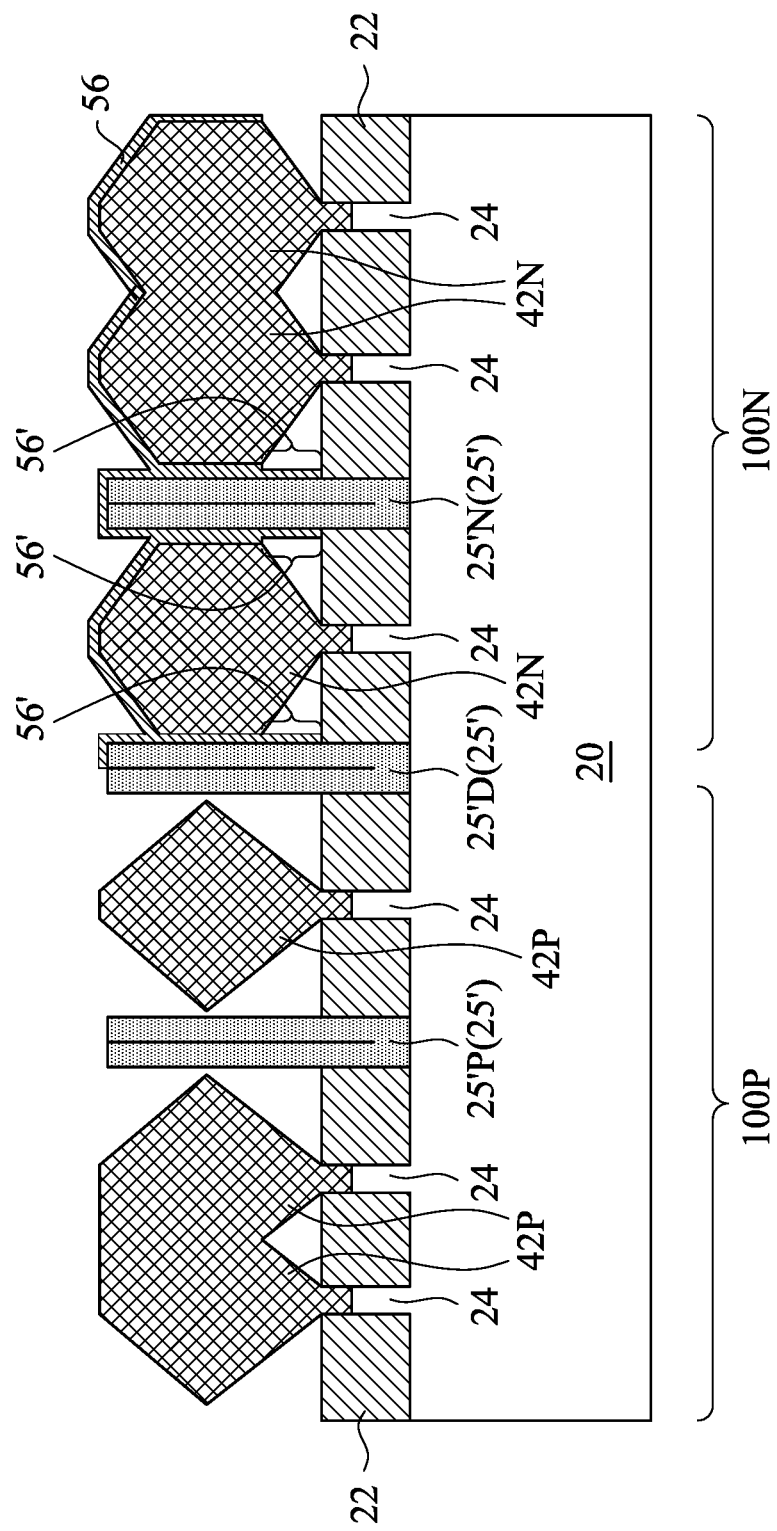
Figure 15:
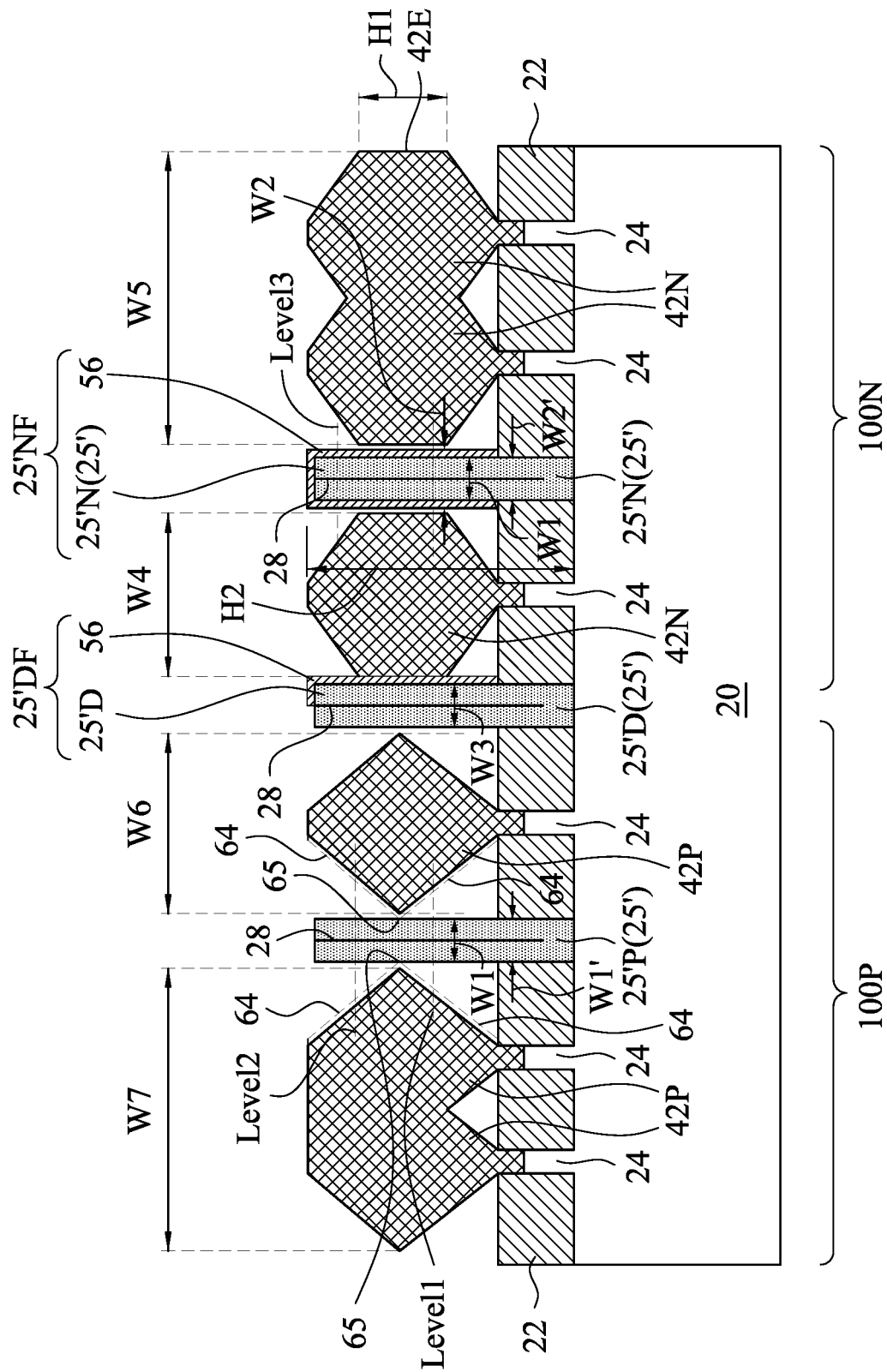

Referring to FIG. 14, epitaxy regions 42P, which are also referred to as epitaxy regions 42, are formed in a second selective epitaxy process, in which a semiconductor material is selectively grown starting from recesses 40P. The respective process is illustrated as process 228 in the process flow 200 as shown in FIG. 23. In accordance with some embodiments, epitaxy regions 42P are formed of or comprise silicon germanium boron (SiGeB), SiB, GeB, Si, or the like. Epitaxy regions 42P form the source/drain regions of the resulting p-type FinFET, and are also referred to as p-type source/drain regions 42P. In accordance with some embodiments, for example, when the epitaxy material is silicon, an implantation process may be performed to implant a p-type impurity. In accordance with alternative embodiments, for example, when the epitaxy material already includes a p-type impurity such as boron, the implantation process may be skipped. Each of epitaxy regions 42P may also include a plurality of sub layers, for example, with the atomic percentage of boron and/or germanium in the sub layers being different from each other. In accordance with some embodiments, epitaxy regions 42P have a diamond shape. Some neighboring epitaxy regions 42P may merge with each other.

Furthermore, epitaxy regions 42P may extend all the way to the neighboring dielectric fins 25'P, or may be spaced apart from the neighboring dielectric fins 25'P by gaps.

The epitaxy process is selective, for example, with an etching gas such as HCl included in the process gas. The selectivity, however, may be adversely lost and result in the epitaxy material to grow on selective-loss defect 54N2 (FIG. 13), causing the selective-loss defect 54N2 to enlarge. Accordingly, the process gases and the process conditions are adjusted so that during the epitaxy for forming epitaxy regions 42P, selective-loss defect 54N2 is selectively etched and removed. This may be achieved, for example, by increasing the flow rate of the etching gas, adjusting the process conditions such as reducing the partial pressure of the precursors (such as $SiH_4$ and $GeH_4$), etc. The respective process is also illustrated as process 228 in the process flow 200 as shown in FIG. 23. With the tuned epitaxy process, and further because n-type epitaxy regions 42N are easier to etch than p-type epitaxy regions 42P, selective-loss defect 54N2 may be removed during the epitaxy of p-type epitaxy regions 42P.

In the embodiments of the present disclosure, when the n-type first process is adopted, the n-type selective-loss defect (54N2) generated in the first epitaxy process may be removed during the second epitaxy process for forming p-type epitaxy regions 42P. If, however, a p-type first process is adopted, p-type selective-loss defects would be generated in a first epitaxy process, and would have to be removed by a second epitaxy process. The p-type selective-loss defects (formed of, for example, SiGeB), however, are difficult to remove since there is no good available process gas and conditions. Accordingly, it is more likely that the p-type selective-loss defects will grow rather than eliminated in the second epitaxy process. Accordingly, n-type first process is adopted in the embodiments of the present disclosure.

An etching process is then performed to remove the remaining portion of epitaxy mask 56 in n-type FinFET region 100N. The remaining portions of epitaxy mask 46 (FIG. 13) may also be removed. The respective process is illustrated as process 230 in the process flow 200 as shown in FIG. 23. The resulting structure is shown in FIG. 15. The etching process is an isotropic process, which may be a dry etching process or a wet etching process, and the etching chemical is selected based on the material of epitaxy mask 56, protruding fins 24'P, and epitaxy regions 42P. Epitaxy regions 42N are thus re-exposed. To reduce the damage of epitaxy regions 42P, the etching process is controlled to be as light as possible. In addition, since epitaxy regions 42N have been formed, which results in the spacing between dielectric fins 25'N and epitaxy regions 42N small, epitaxy mask 56 is not fully removed. The remaining of etching mask 56 has been observed in Transmission Electron Microscopy (TEM) images of sample wafers.

FIG. 15 illustrates dielectric fins 25'P and 25'N after epitaxy regions 42P and 42N are formed. Throughout the description, dielectric fin 25'N and the overlying remaining epitaxy mask 56 are collectively referred to as dielectric fin 25'NF. The materials of dielectric fin 25'N and epitaxy mask 56 may be the same as each other, and hence may not be distinguishable from each other, or may not be different from each other. Dielectric fins 25'P and 25'NF have widths W1 and W2, respectively. When epitaxy regions 42P and 42N are spaced apart from the neighboring dielectric fins 25'P and 25'N, the corresponding widths W1 and W2 are measured at the middle height (level 1) of dielectric fins 25'P and 25'NF. When epitaxy regions 42P and 42N join the neighboring dielectric fins 25'P and 25'N, widths W1 and W2 are measured at the levels (levels 2 and 3) in the middle between top surfaces of dielectric fins 25'P and 25'NF and the corresponding joining points. For example, dashed lines 64 are drawn to show the sidewalls of epitaxy regions 42P joining dielectric fin 25'P. Accordingly, width W1 is measured at level 2, which is in the middle between the top surface level and the joining points 65.

Since dielectric fins 25'P and 25'N have the same width W1, width W2 of dielectric fin 25'NF is greater than the width W1 of dielectric fin 25'P. In accordance with some embodiments, width W1 is in the range between about 3 nm and about 20 nm, and width W2 is in the range between about 4 nm and about 25 nm. Width difference (W2−W1) may be in the range between about 1 nm and about 5 nm. The width difference between widths W2 and W1 is an indication that an n-first process is used for forming source/drain regions. In accordance with some embodiments, the dielectric fin 25'D may have epitaxy mask 56 on its sidewall facing the n-type FinFET region 100N, while on the side facing the p-type FinFET region 100P, no epitaxy mask 56 is left. Dielectric fin 25'D and the corresponding epitaxy mask 56 are collectively referred to as dielectric fin 25'DF, which has width W3 measured at level 1 or level 2 or 3. There may exists the relationship W2>W3>W1. Furthermore, width difference (W2−W3) and (W3−W1) may be in the range between about 0.5 nm and about 2.5 nm. In accordance with alternative embodiments, due to process reasons, there exists the relationship W2>W1>W3. Widths W1', W2', W3' measured at a level slightly lower than the top surfaces of STI regions 22, on the other hand, may be equal to each other.

Some example values of the illustrated features are provided herein. In accordance with some embodiments, n-type source/drain regions 42N have straight edges 42E, with the height H1 being in the range between about 5 nm and about 50 nm. The width W4 of single-fin source/drain region 42N may be in the range between about 20 nm and about 40 nm, and the width W5 of double-fin source/drain region 42N may be in the range between about 33 nm and about 66 nm. The width W6 of single-fin source/drain region 42P may be in the range between about 21 nm and about 45 nm, and the width W7 of double-fin source/drain region 42P may be in the range between about 31 nm and about 71 nm. The height H2 of dielectric strips 25'P and 25'N may be in the range between about 30 nm and about 130 nm, wherein the height H2 is measured from the tops of the dielectric fins to the bottoms of the corresponding underlying STI regions 22.

Figure 16A:
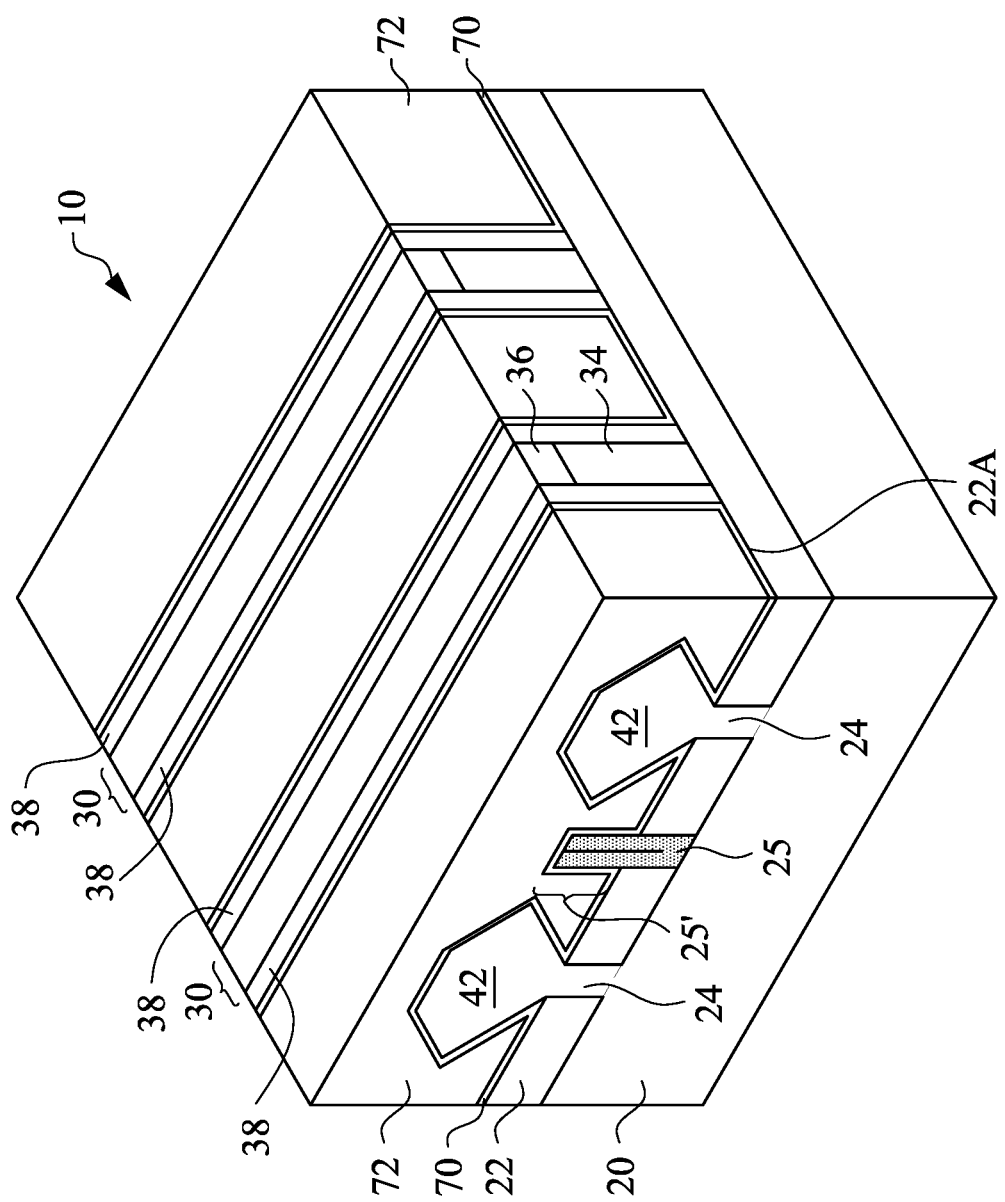
Figure 16B:
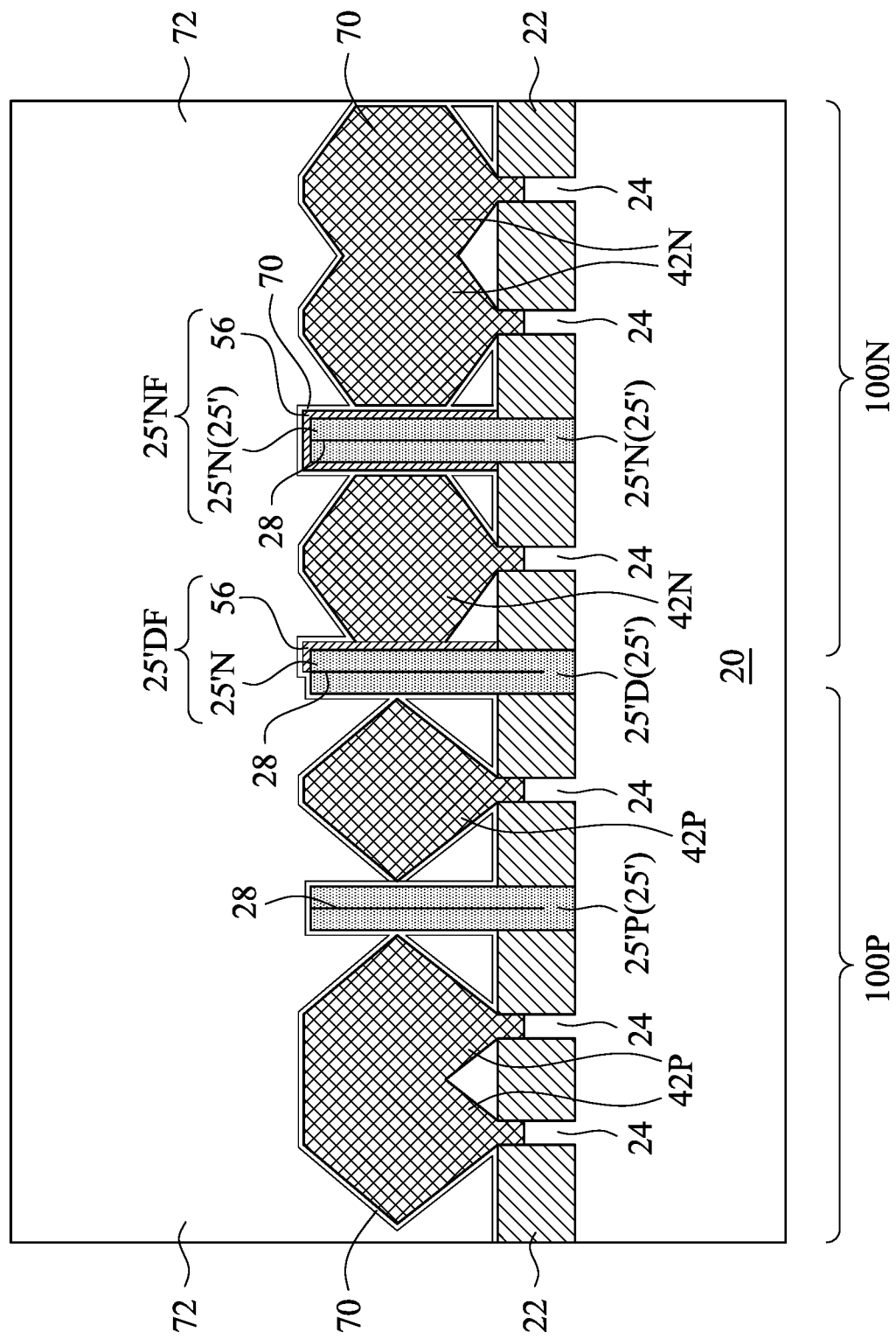

FIGS. 16A and 16B illustrate a perspective view and a cross-sectional view, respectively, of the structure after the formation of Contact Etch Stop Layer (CESL) 70 and Inter-Layer Dielectric (ILD) 72. The respective process is illustrated as process 232 in the process flow 200 as shown in FIG. 23. CESL 70 may be formed of silicon nitride, silicon carbo-nitride, or the like. CESL 70 may be formed using a conformal deposition method such as ALD or CVD, for example. ILD 72 may include a dielectric material formed using, for example, FCVD, spin-on coating, CVD, or another deposition method. ILD 72 may also be formed of or comprise an oxygen-containing dielectric material, which may be silicon-oxide based such as silicon oxide, Phospho-Silicate Glass (PSG), Boro-Silicate Glass (BSG), Boron-Doped Phospho-Silicate Glass (BPSG), or the like. A planarization process such as a CMP process or a mechanical grinding process is performed to level the top surfaces of ILD 72, dummy gate stacks 30, and gate spacers 38 with each other.

Figure 17:
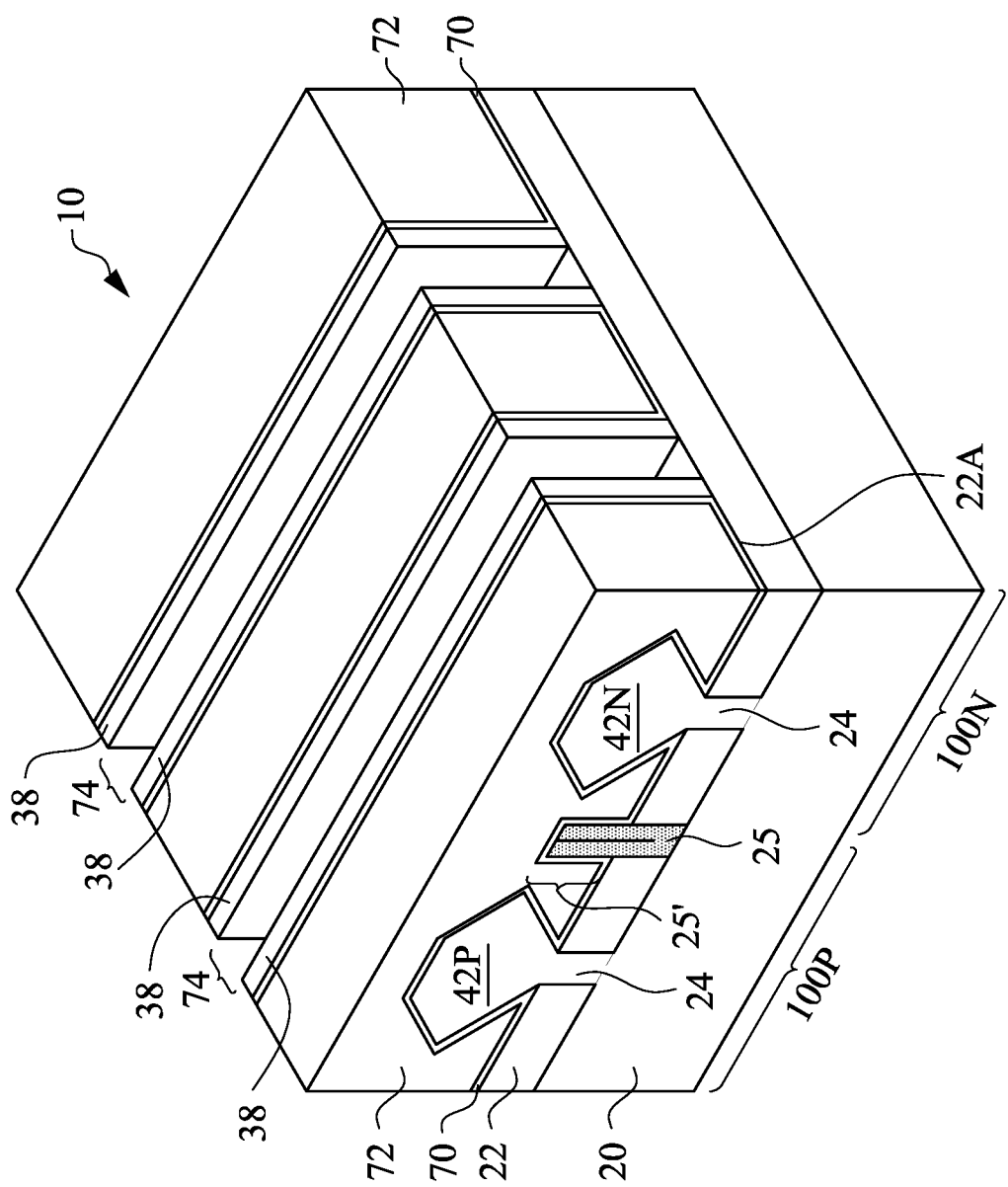

Dummy gate stacks 30 are then removed through etching, and the resulting structure is shown in FIG. 17. Trenches 74 are formed in the space left by the removed dummy gate stacks 30.

Figure 18:
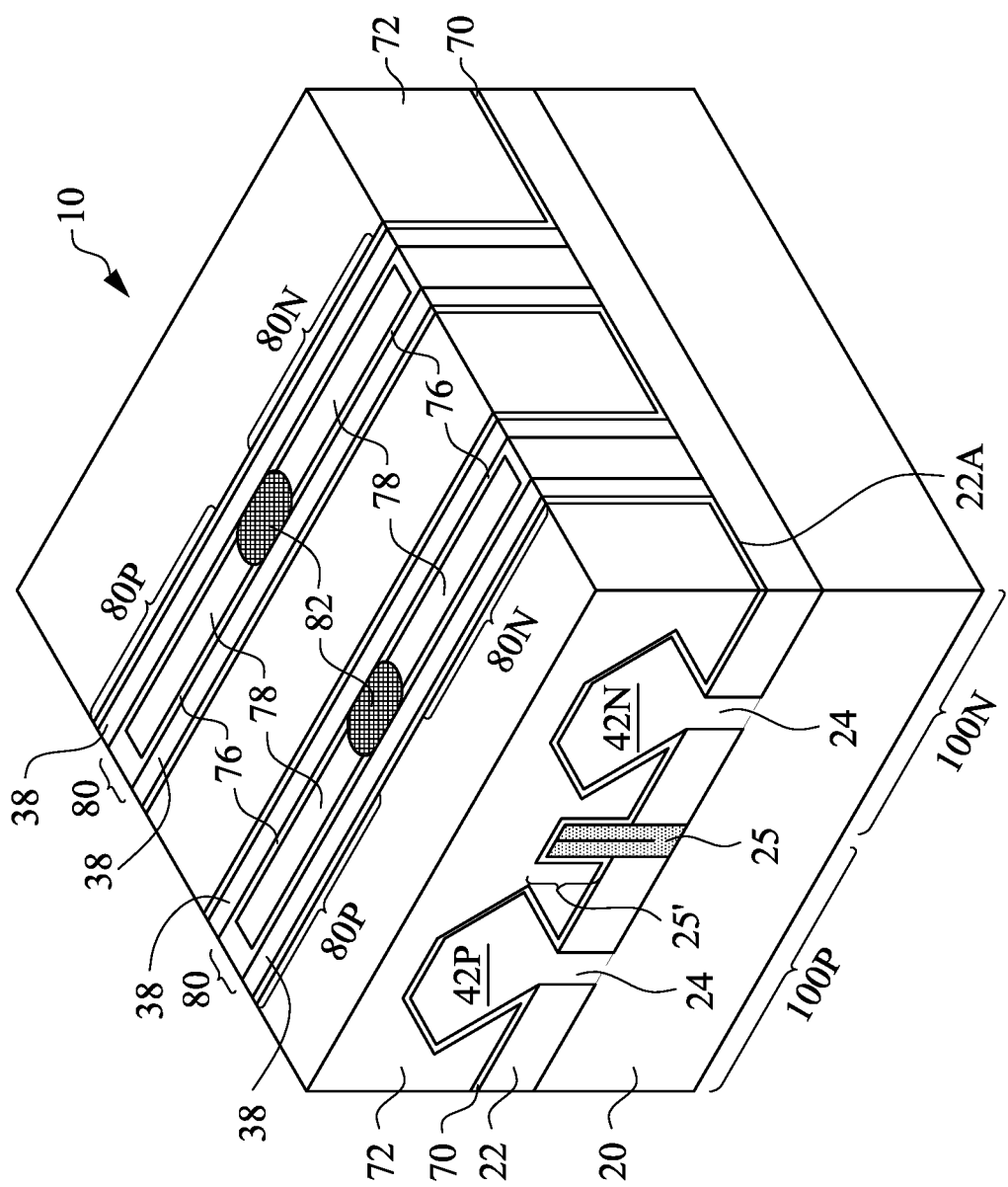

FIG. 18 illustrates the formation of replacement gate stacks 80, which include replacement gate stacks 80P and 80N. The respective process is illustrated as process 234 in the process flow 200 as shown in FIG. 23. Replacement gate stacks 80 include gate dielectrics 76 and gate electrodes 78. Next, isolation regions 82 are formed to cut replacement gate stacks 80 into gate stacks 80P and 80N, wherein the gate stacks 80P are the replacement gate stacks of a p-type FinFET, and gate stacks 80N are the replacement gate stacks of an n-type FinFET. Isolation regions 82 extend to dielectric fin 25', so that gate stacks 80P are electrically disconnected from the corresponding gate stacks 80N.

Figure 19:
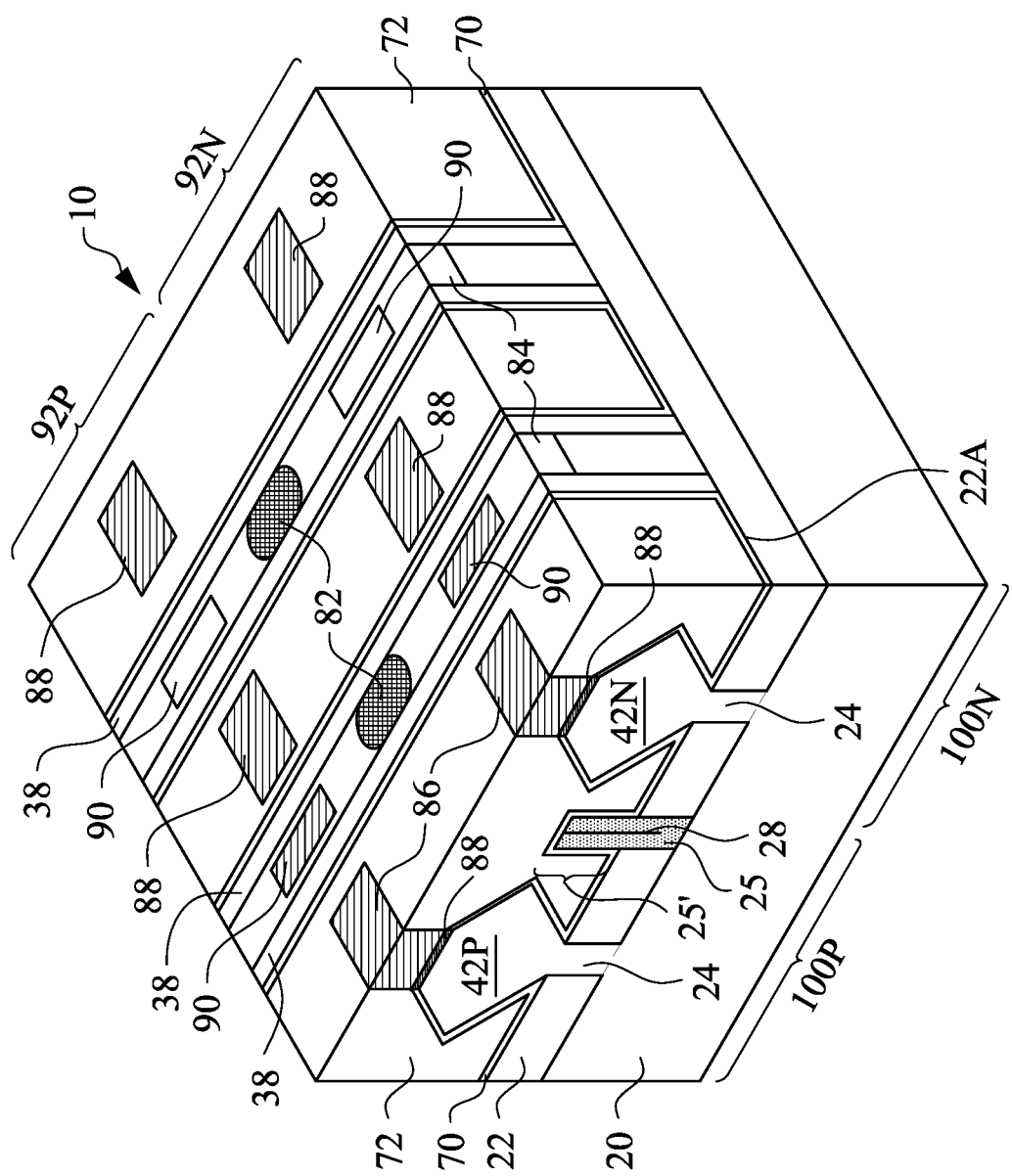

Replacement gate stacks 80 are then etched back, resulting in recesses to be formed between opposite gate spacers 38. Next, as shown in FIG. 19, hard masks 84 are formed in the recesses. In accordance with some embodiments of the present disclosure, the formation of hard masks 84 includes a deposition process to fill the recesses with a dielectric material, and a planarization process to remove the excess dielectric material over gate spacers 38 and ILD 72. Hard masks 84 may be formed of silicon nitride, for example, or other like dielectric materials.

FIG. 19 further illustrates some of the features formed in subsequent processes, which may include source/drain contact plugs 86, source/drain silicide regions 88, and gate contact plugs 90. P-type FinFET 92P and n-type FinFET 92N are thus formed.

Figure 20:
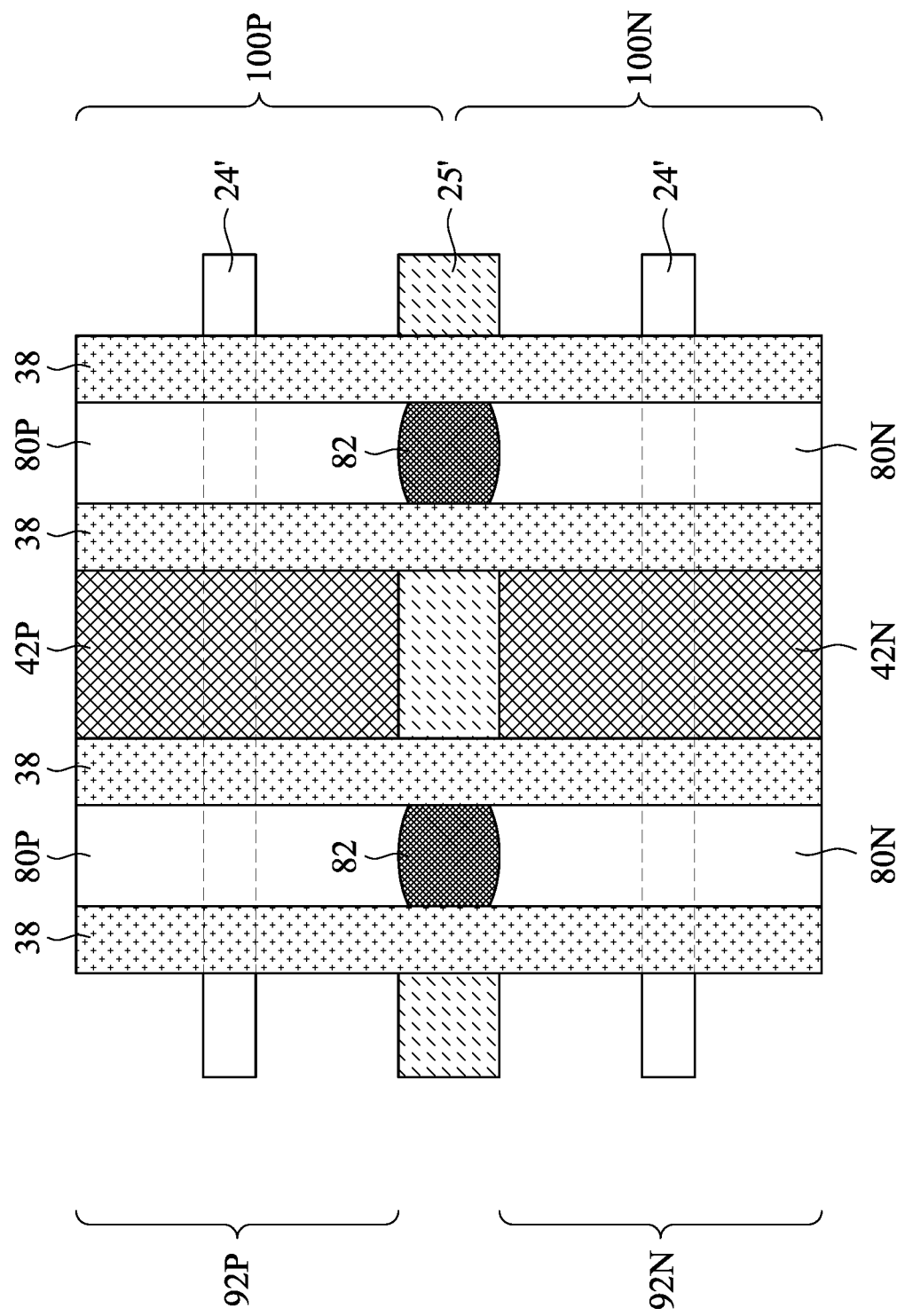

FIG. 20 illustrates a top view of the structure shown in FIG. 19 in accordance with some embodiments. P-type FinFET 92P includes gate stack 80P and sourced/drain regions 42P formed based on protruding fins 24'. N-type FinFET 92N includes gate stack 80N and sourced/drain regions 42N formed based on protruding fins 24'.

Figure 21:
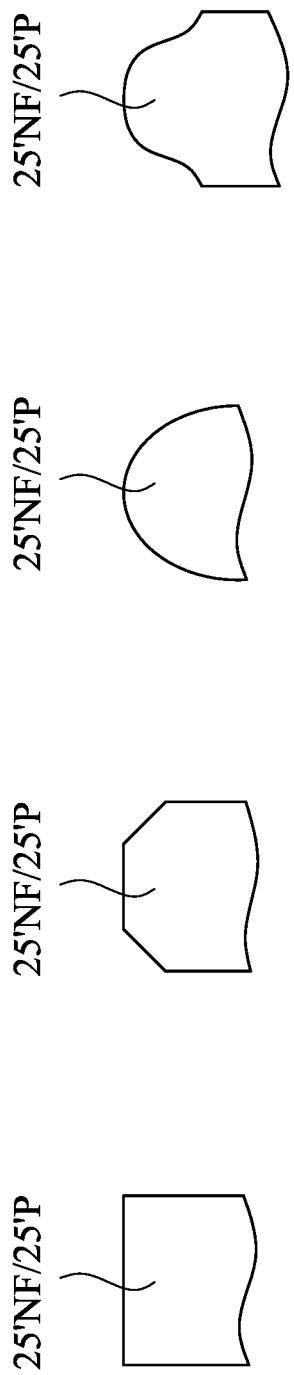
FIG. 21 illustrates the profiles of dielectric fins in accordance with some embodiments.

FIG. 21 illustrates several possible cross-sectional view shapes of the top end of dielectric fin 25'P or 25'NF (FIG. 15) in accordance with some embodiments. A first possible shape is a square, wherein angles formed between the top surface and sidewalls are substantially equal to 90 degrees. The second shape is a chamfer-shape, on which the top corners have fixed-angle transition and the top length is smaller than the width of the underlying parts. The third shape is rounded. The fourth shape is a gourd shape.

Figure 22:
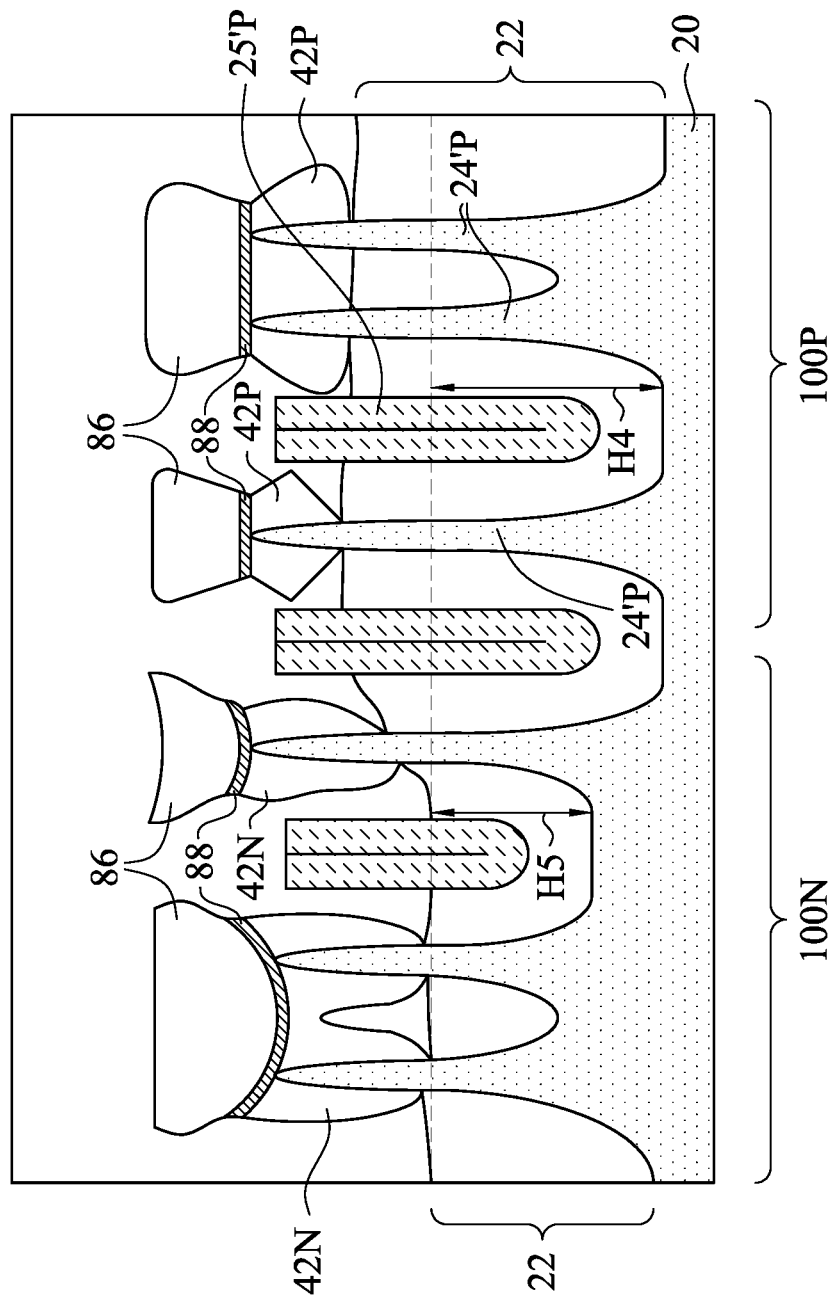
FIG. 22 illustrates an example of n-type and p-type source/drain regions and dielectric fins in between in accordance with some embodiments.

FIG. 22 illustrates the shape of features in an example structure, and represents the structure shown in FIG. 15, except the p-type FinFET region 100P is shown on the right side, rather than on the left side, of n-type FinFET region 100N. It is appreciated that the height H4 of STI region 22 in the p-type FinFET region 100P may be greater than the height H5 of STI region 22 in the n-type FinFET region 100N.

The embodiments of the present disclosure have some advantageous features. By performing n-type first epitaxy processes, it is easier to remove selective-loss defects than in p-type first epitaxy processes. Accordingly, the selective-loss defects generated in the earlier n-type epitaxy process may be easily removed in the later performed p-type epitaxy process.

In accordance with some embodiments of the present disclosure, a method comprises forming a first semiconductor fin and a first dielectric fin in an n-type FinFET region; forming a second semiconductor fin and a second dielectric fin in a p-type FinFET region; forming a first epitaxy mask to cover the second semiconductor fin and the second dielectric fin; performing a first epitaxy process to form an n-type epitaxy region based on the first semiconductor fin; removing the first epitaxy mask; forming a second epitaxy mask to cover the n-type epitaxy region and the first dielectric fin; performing a second epitaxy process to form a p-type epitaxy region based on the second semiconductor fin; and removing the second epitaxy mask, wherein after the second epitaxy mask is removed, a first portion of the second epitaxy mask is left on the first dielectric fin. In an embodiment, after the removing the first epitaxy mask, substantially no portion of the first epitaxy mask is left on the second dielectric fin. In an embodiment, each of the first epitaxy mask and the second epitaxy mask has a thickness in a range between about 0.5 nm and about 2.5 nm. In an embodiment, the method further comprises forming a third dielectric fin dividing the n-type FinFET region from the p-type FinFET region, wherein at a time after the second epitaxy mask is removed, a second portion of the second epitaxy mask is left on a first side of the third dielectric fin, with the first side facing the n-type FinFET region. In an embodiment, at the time, no portion of the first epitaxy mask and the second epitaxy mask is left on a second side of the third dielectric fin, with the second side facing the p-type FinFET region. In an embodiment, in the first epitaxy process, a portion of an n-type semiconductor material for forming the n-type epitaxy region is formed on a dielectric material in the p-type FinFET region as a defect, and during the second epitaxy process, the defect is removed. In an embodiment, the second epitaxy mask and the first dielectric fin are formed of a same dielectric material. In an embodiment, both of the second epitaxy mask and the first dielectric fin comprise Si, O, C, and N. In an embodiment, the second epitaxy mask and the first dielectric fin are formed of different dielectric materials.

In accordance with some embodiments of the present disclosure, a structure comprises an n-type FinFET region and a p-type FinFET region; an n-type FinFET in the n-type FinFET region, wherein the n-type FinFET comprises a first semiconductor fin; a first gate stack on the first semiconductor fin; and an n-type source/drain region aside the first gate stack; a first dielectric fin in the n-type FinFET region, wherein the first dielectric fin has a first width; a p-type FinFET in the p-type FinFET region, wherein the p-type FinFET comprises a second semiconductor fin; a second gate stack on the second semiconductor fin; and a p-type source/drain region aside the second gate stack; and a second dielectric fin in the p-type FinFET region, wherein the second dielectric fin has a second width smaller than the first width. In an embodiment, the first width is greater than the second width by a difference greater than about 1 nm. In an embodiment, the difference is in a range between about 1 nm and about 5 nm. In an embodiment, the first dielectric fin comprises an inner portion formed of a first material; and an outer portion on sidewalls of the inner portion, wherein the outer portion is formed of a second material different from the first material. In an embodiment, the second dielectric fin comprises the first material, and is free from the second material. In an embodiment, the inner portion of the first dielectric fin comprises an upper portion; a middle portion below the upper portion, wherein the middle portion is in physical contact with the n-type source/drain region; and a lower portion below the middle portion, wherein the lower portion is free from the outer portion formed on its sidewall. In an embodiment, the n-type source/drain region and the first dielectric fin have no fin located therebetween, and wherein the p-type source/drain region and the second dielectric fin have no fin located therebetween.

In accordance with some embodiments of the present disclosure, a structure comprises a semiconductor substrate; a plurality of isolation regions extending into the semiconductor substrate; a first n-type source/drain region and a second n-type source/drain region extending higher than top surfaces of the plurality of isolation regions; a first dielectric fin between the first n-type source/drain region and the second n-type source/drain region, wherein the first dielectric fin has a first width measured at a first level higher than the top surfaces of the plurality of isolation regions, and a second width measured at a second level lower than the top surfaces of the plurality of isolation regions; a first p-type source/drain region and a second p-type source/drain region extending higher than the top surfaces of the plurality of isolation regions; and a second dielectric fin between the first p-type source/drain region and the second p-type source/drain region, wherein the second dielectric fin has a third width measured at the first level, and a fourth width measured at the second level, and wherein the first width is greater than the third width. In an embodiment, the second width is equal to the fourth width. In an embodiment, the first dielectric fin contacts the first n-type source/drain region and the second n-type source/drain region, and an upper portion of the first dielectric fin has the first width, and a lower portion of the first dielectric fin is narrower than the upper portion. In an embodiment, the first dielectric fin comprises an inner portion formed of a first material; and an outer portion on sidewalls of the inner portion, wherein the outer portion is formed of a second material different from the first material.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
    forming a first semiconductor fin and a second semiconductor fin in an n-type Fin Field-Effect Transistor (FinFET) region and a p-type FinFET region, respectively;
    forming a first dielectric fin and a second dielectric fin in the n-type FinFET region and the p-type FinFET region, respectively;
    forming a first epitaxy mask to cover the second semiconductor fin and the second dielectric fin;
    performing a first epitaxy process to form an n-type epitaxy region based on the first semiconductor fin;
    removing the first epitaxy mask;
    forming a second epitaxy mask to cover the n-type epitaxy region and the first dielectric fin;
    performing a second epitaxy process to form a p-type epitaxy region based on the second semiconductor fin; and
    removing the second epitaxy mask, wherein after the second epitaxy mask is removed, a first portion of the second epitaxy mask is left on the first dielectric fin.

2. The method of claim 1, wherein after the removing the first epitaxy mask, substantially no portion of the first epitaxy mask is left on the second dielectric fin.

3. The method of claim 1, wherein each of the first epitaxy mask and the second epitaxy mask has a thickness in a range between about 0.5 nm and about 2.5 nm.

4. The method of claim 1 further comprising forming a third dielectric fin dividing the n-type FinFET region from the p-type FinFET region, wherein at a time after the second epitaxy mask is removed, a second portion of the second epitaxy mask is left on a first side of the third dielectric fin, with the first side facing the n-type FinFET region.

5. The method of claim 4, wherein at the time, no portion of the first epitaxy mask and the second epitaxy mask is left on a second side of the third dielectric fin, with the second side facing the p-type FinFET region.

6. The method of claim 1, wherein in the first epitaxy process, a portion of an n-type semiconductor material for forming the n-type epitaxy region is formed on a dielectric material in the p-type FinFET region as a defect, and during the second epitaxy process, the defect is removed.

7. The method of claim 1, wherein the second epitaxy mask and the first dielectric fin are formed of a same dielectric material.

8. The method of claim 7, wherein both of the second epitaxy mask and the first dielectric fin comprise Si, O, C, and N.

9. The method of claim 1, wherein the second epitaxy mask and the first dielectric fin are formed of different dielectric materials.

10. A structure comprising:
    an n-type Fin Field-Effect (FinFET) region and a p-type FinFET region;
    an n-type FinFET in the n-type FinFET region, wherein the n-type FinFET comprises:
        a first semiconductor fin;
        a first gate stack on the first semiconductor fin; and
        an n-type source/drain region aside the first gate stack;
    a first dielectric fin in the n-type FinFET region, wherein the first dielectric fin has a first width;
    a p-type FinFET in the p-type FinFET region, wherein the p-type FinFET comprises:
        a second semiconductor fin;
        a second gate stack on the second semiconductor fin; and
        a p-type source/drain region aside the second gate stack; and
    a second dielectric fin in the p-type FinFET region, wherein the second dielectric fin has a second width smaller than the first width.

11. The structure of claim 10, wherein the first width is greater than the second width by a difference greater than about 1 nm.

12. The structure of claim 11, wherein the difference is in a range between about 1 nm and about 5 nm.

13. The structure of claim 10, wherein the first dielectric fin comprises:
    an inner portion formed of a first material; and
    an outer portion on sidewalls of the inner portion, wherein the outer portion is formed of a second material different from the first material.

14. The structure of claim 13, wherein the second dielectric fin comprises the first material, and is free from the second material.

15. The structure of claim 13, wherein the inner portion of the first dielectric fin comprises:
- an upper portion;
- a middle portion below the upper portion, wherein the middle portion is in physical contact with the n-type source/drain region; and
- a lower portion below the middle portion, wherein the lower portion is free from the outer portion formed on its sidewall.

16. The structure of claim 10, wherein the n-type source/drain region and the first dielectric fin have no fin located therebetween, and wherein the p-type source/drain region and the second dielectric fin have no fin located therebetween.

17. A structure comprising:
- a semiconductor substrate;
- a plurality of isolation regions extending into the semiconductor substrate;
- a first n-type source/drain region and a second n-type source/drain region extending higher than top surfaces of the plurality of isolation regions;
- a first dielectric fin between the first n-type source/drain region and the second n-type source/drain region, wherein the first dielectric fin has a first width measured at a first level higher than the top surfaces of the plurality of isolation regions, and a second width measured at a second level lower than the top surfaces of the plurality of isolation regions;
- a first p-type source/drain region and a second p-type source/drain region extending higher than the top surfaces of the plurality of isolation regions; and
- a second dielectric fin between the first p-type source/drain region and the second p-type source/drain region, wherein the second dielectric fin has a third width measured at the first level, and a fourth width measured at the second level, and wherein the first width is greater than the third width.

18. The structure of claim 17, wherein the second width is substantially equal to the fourth width.

19. The structure of claim 17, wherein the first dielectric fin contacts the first n-type source/drain region and the second n-type source/drain region, and an upper portion of the first dielectric fin has the first width, and a lower portion of the first dielectric fin is narrower than the upper portion.

20. The structure of claim 17, wherein the first dielectric fin comprises:
- an inner portion formed of a first material; and
- an outer portion on sidewalls of the inner portion, wherein the outer portion is formed of a second material different from the first material.

* * * * *